US012424498B2

(12) United States Patent
Sreenivasan et al.

(10) Patent No.: US 12,424,498 B2
(45) Date of Patent: Sep. 23, 2025

(54) SYSTEM AND METHOD FOR MODIFICATION OF SUBSTRATES

(71) Applicant: Board of Regents, The University of Texas System, Austin, TX (US)

(72) Inventors: Sidlgata V. Sreenivasan, Austin, TX (US); Shrawan Singhal, Austin, TX (US); Lawrence R. Dunn, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 782 days.

(21) Appl. No.: 17/413,523

(22) PCT Filed: Dec. 13, 2019

(86) PCT No.: PCT/US2019/066207
§ 371 (c)(1),
(2) Date: Jun. 11, 2021

(87) PCT Pub. No.: WO2020/123929
PCT Pub. Date: Jun. 18, 2020

(65) Prior Publication Data
US 2022/0013417 A1    Jan. 13, 2022

Related U.S. Application Data

(60) Provisional application No. 62/779,091, filed on Dec. 13, 2018.

(51) Int. Cl.
*H01L 21/66* (2006.01)
*G03F 7/00* (2006.01)
(Continued)

(52) U.S. Cl.
CPC ............ *H01L 22/12* (2013.01); *G03F 7/0002* (2013.01); *G03F 7/16* (2013.01); *G05B 13/042* (2013.01); *H01L 21/31051* (2013.01)

(58) Field of Classification Search
CPC .................................................. H01L 22/12
See application file for complete search history.

(56) References Cited

U.S. PATENT DOCUMENTS 6,982,783 B2    1/2006    Choi et al.
7,307,697 B2   12/2007    GanapathiSubramanian et al.
(Continued)

FOREIGN PATENT DOCUMENTS

| TW | 201003738 A | 1/2010 |
| WO | 2017201431 A1 | 11/2017 |
| WO | 2018027069 A1 | 2/2018 |

OTHER PUBLICATIONS

Second Notice of Reasons for Refusal for Japanese Patent Application No. 2021-534137 dated Jul. 26, 2024, pp. 1-2.
(Continued)

*Primary Examiner* — William A Harriston
(74) *Attorney, Agent, or Firm* — Robert A. Voigt, Jr.; Shackelford, McKinley & Norton, LLP

(57) ABSTRACT

Various embodiments of the present technology generally relate to substrate planarization. More specifically, some embodiments of the present technology relate a versatile systems and methods for precision surface topography optimization known as planarization on nominally planar substrates. In some embodiments, a method for planarization of a patterned substrate using inkjets can determine the global and nanoscale topography and pattern information of the patterned substrate. Based upon the global and nanoscale topography and pattern information, a drop pattern can be determined and then dispensed on the patterned substrate. A gap between the patterned substrate and a superstrate causing the dispensed drops can be closed to form a substantially contiguous film. The substantially contiguous film can be cured and the superstrate can be separated from the pat-
(Continued)

terned substrate with substantially contiguous film on the patterned substrate.

12 Claims, 9 Drawing Sheets

(51) Int. Cl.
*G03F 7/16* (2006.01)
*G05B 13/04* (2006.01)
*H01L 21/3105* (2006.01)

(56) References Cited

U.S. PATENT DOCUMENTS

| | | | |
|---|---|---|---|
| 7,325,206 | B2 | 1/2008 | White et al. |
| 8,394,282 | B2 | 3/2013 | Panga et al. |
| 9,415,418 | B2 | 8/2016 | Sreenivasan et al. |
| 9,718,096 | B2 * | 8/2017 | Sreenivasan ........ H01L 21/0271 |
| 9,865,832 | B2 | 1/2018 | Bibl et al. |
| 9,987,653 | B2 | 6/2018 | Sreenivasan et al. |
| 2005/0241177 | A1 | 11/2005 | Kolb et al. |
| 2012/0006385 | A1 | 1/2012 | Hassan et al. |
| 2016/0351409 | A1 * | 12/2016 | Takahata ............. H01L 21/0274 |
| 2017/0106399 | A1 | 4/2017 | Sreenivasan et al. |
| 2017/0131640 | A1 * | 5/2017 | Sreenivasan .......... G03F 9/7042 |
| 2017/0333940 | A1 * | 11/2017 | Sreenivasan ............... B41J 2/01 |

OTHER PUBLICATIONS

Reddy et al., "Dynamics of Low Capillary Number Interfaces Moving Through Sharp Features," Physics of Fluids, vol. 17, 2005, pp. 1-6.
Snyder et al., "Automated Tuning of High-Order Waveforms for Picoliter Resolution Jetting of Rheologically Challenging Materials," Precision Engineering, vol. 56, 2019, pp. 143-155.
International Search Report for International Application No. PCT/US2019/066207 dated Apr. 21, 2020, pp. 1-4.
Written Opinion of the International Searching Authority for International Application No. PCT/US2019/066207 dated Apr. 21, 2020, pp. 1-8.
David Quere, "Wetting and Roughness," Annual Review of Materials Research, vol. 38, 2008, pp. 71-99.
Reyssat et al., "Impalement of Fakir Drops," Europhysics Letters, vol. 81, No. 2, Dec. 20, 2007, pp. 1-5.
Kusumaatmaja et al., "Anisotropic Drop Morphologies on Corrugated Surfaces," Langmuir, vol. 24, No. 14, 2008, pp. 7299-7308.
Singhal et al., "Mechanics-Based Approach for Detection and Measurement of Particle Contamination in Proximity Nanofabrication Processes," Journal of Micro- and Nano-Manufacturing, vol. 4, Sep. 2016, pp. 1-7.
Partial European Search Report for European Patent Application No. 19 896 567.5 dated Aug. 17, 2022, pp. 1-18.

* cited by examiner

Liquid Front Scenarios

SYSTEM AND METHOD FOR MODIFICATION OF SUBSTRATES

CROSS-REFERENCE TO RELATED APPLICATION

This application claims priority to U.S. Provisional Application Ser. No. 62/779,091 filed Dec. 13, 2018, which is incorporated herein by reference in its entirety for all purposes.

STATEMENT REGARDING FEDERALLY SPONSORED RESEARCH

This invention was made with government support under Grant no. ECCS1120823 awarded by the National Science Foundation. The government has certain rights in the invention.

TECHNICAL FIELD

Various embodiments of the present technology generally relate to substrate planarization. More specifically, some embodiments of the present technology relate to versatile systems and methods for precision surface topography optimization known as planarization on nominally planar substrates.

BACKGROUND

A process, such as the Programmable Adaptive Inkjetting of Nanoscale Thin-Films (PAINT) process, can be utilized for depositing films of tailored thickness at near-zero material wastage. PAINT is substantially agnostic towards the choice of substrate type, thickness or material and is capable of depositing films over large areas. By design, PAINT can also substantially decouple the influence of systematic parasitics, such as low-spatial frequency surface topography, inkjet drop volume variation, etc., and prevent them from corrupting the final film thickness.

However, in such a process, when the surface of the substrate is of primary importance, such as in planarization, surface profile metrology is needed to obtain a map of nominal and parasitic topography on the substrate. The surface profile metrology needs to measure the topography of the final surface closest to the "superstrate" (utilized for urging liquid organic material drops that were dispensed by an inkjet to merge laterally across the substrate) just prior to the execution of the PAINT process.

SUMMARY

Systems and methods are described for substrate planarization. More specifically, some embodiments of the present technology relate to versatile systems and methods for precision surface topography optimization known as planarization on nominally planar substrates. In some embodiments, a method for planarization of a patterned substrate using inkjets uses the global and nanoscale topography and pattern information of the patterned substrate. For example, the topography and pattern information can be loaded from a digital file encoded with data. Based upon the global and nanoscale topography and pattern information, a drop pattern can be determined and then dispensed on the patterned substrate. A gap between the patterned substrate and a superstrate can be closed causing the dispensed drops to form a substantially contiguous film. The substantially contiguous film can be cured and the superstrate can be separated from the patterned substrate with the substantially contiguous film on the patterned substrate. In accordance with various embodiments, the gap can be closed at a first station and curing is performed at a second station. The curing can be performed at the end of a desired process time chosen to be high enough such that bubbles are substantially mitigated and low enough to prevent undesirable parasitics from affecting planarization performance In some embodiments, the drop pattern can be determined from a model of a process, an optimization scheme, and/or experimental data. For example, the drop pattern can be computed using model-based optimization with inputs including the global and nanoscale topography and the pattern information, superstrate geometry, superstrate material properties, planarizing material properties, inkjet drop resolution, inkjet nozzle pitch, and tolerance information. The surface of the superstrate may be substantially more convex than the surface of the substrate at a location of a spreading front. In some embodiments, the superstrate has a sacrificial film and the method further comprises, ablating the sacrificial film to initiate peeling to separate the superstrate from the substrate.

The planarization performance in a sub-region of a semiconductor device die can be prioritized in some embodiments. For example, the sub-region of the semiconductor device die may correspond to a portion of the semiconductor device die where a substantially high lithographic resolution is needed during a subsequent lithography process. As another example, the sub-region can be aligned orthogonal to a scanning direction of a photolithography scanner during exposure, wherein the photolithography scanner is a downstream process whose focus benefits from a surface topography control. In some embodiments, the inkjet can be aligned parallel to the sub-region.

Some embodiments provide for mitigation of hot spots arising from bubbles or voids in a nanoimprint lithography process. Some methods can include identifying a hot spot on a substrate. The hot spot may be caused by particles, bubbles or voids. For example, the hot spot may be caused by particles still trapped between a superstrate and a substrate. The hot spot can be identified using a high-resolution imaging system that images in a liquid phase or in a post-UV cure solid phase. Then, based upon characteristics of the hot spot, a compensation solution can be identified and implemented to mitigate the hot spot. The compensation solution may include controlled evaporation, a pressure zone chuck, digital micromirror device, or a programmable heater array.

A method for mitigation of systematic hot spots arising from a nanoimprint lithography process is provided by various embodiments. The method can include identifying a hot spot prior to the beginning of the nanoimprint lithography process. Based upon characteristics of the hot spot, a compensation solution can be identified and implemented to mitigate the hotspot. In some embodiments, the compensation solution may only be applied in a region within a vicinity of the hot spot. The compensation solution may include controlled evaporation, a pressure zone chuck, digital micromirror device or a programmable heater array. The pressure zone chuck can be a programmable pressure zone chuck configured to squeeze on a superstrate, a substrate or on both sides in a vicinity of the hot spot. The programmable heater array can be configured to induce thermo-capillary flow in a vicinity of the hot spot. The compensation solution can include selecting a superstrate thickness variation to mitigate systematic hot spots to achieve desired planarization.

In some embodiments, the hot spot can be classified based on the characteristics of the hot spot. A drop pattern can be computed that compensates for the hot spot. Then the drop pattern can be applied. The hot spot can be a systematic or non-systematic hot spot. A systematic hot spot can include variable process times, variable pattern densities, or contact line pinning. The systematic hot spots may result, for example, from upstream, in-process, or downstream processes (e.g., in a nanoimprint lithography process or a planarization process).

In some embodiments, the thickness variation selected may be a smooth function of a spatial coordinate or is a step function of the spatial coordinate. The thickness variation may be a function identified by alignment marks. In some embodiments, the alignment marks can be registered against alignment marks on a substrate to less than 10 microns. The thickness variation function can be selected based on alignment marks that are registered against alignment marks on a substrate to better than 1 micron.

Embodiments of the present technology also include computer-readable storage media containing sets of instructions to cause one or more processors to perform the methods, variations of the methods, and other operations described herein.

Some embodiments provide for a system for planarization comprising, a processor, a substrate shape modulation chuck under the control of the processor, a superstrate shape modulation chuck under the control of the processor, and a memory. The memory can have a set of instructions stored thereon that when executed by the processor cause a machine to identify time varying shapes of a substrate and a superstrate to maximize a relative curvature between the substrate and the superstrate at all times between initiation of contact and completion of substantially conformal contact between the substrate and the superstrate. In some embodiments, at least one of the two curvatures of the superstrate and the substrate at least one time between initiation of contact and completion of substantially conformal contact between the substrate and the superstrate is concave.

Some embodiments can include a camera with a camera pixel size is at least 100 ums, at least 10 ums, or at least 1 ums. The camera may be RGB or grayscale. In some embodiments, the camera may be linescan, area, or telecentric. In some embodiments, a center location of the particle can be used to detect small areas around that point to look for defects caused by damage on the superstrate that may have propagated in the region of contact with the particle.

A method for detection of systematic hot spots arising from a nanoimprint lithography process can include fabricating a dummy template with features larger than a nanoscale resolution template. The dummy template substantially can mimic a physical characteristic of the nanoscale resolution template. The mimicked physical characteristic of the nanoscale resolution template can lead to substantially similar defects. The dummy template can be used to conduct the nanoimprint lithography process.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

Figure 1A:
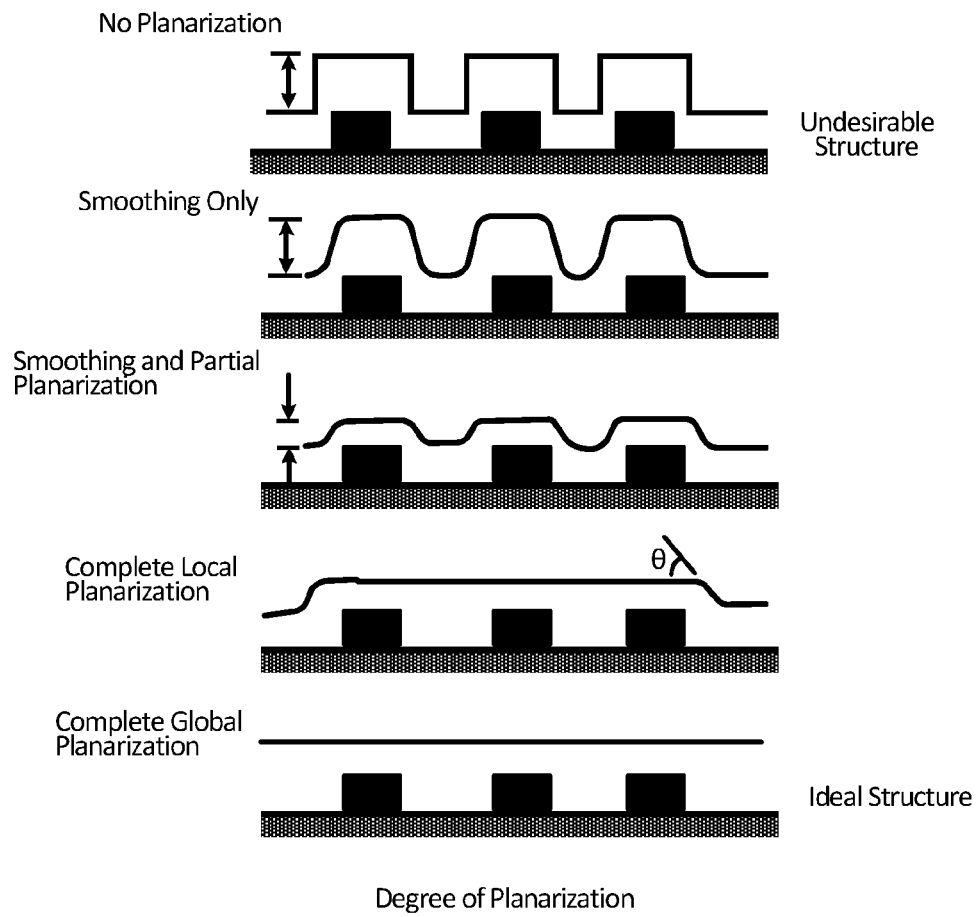
FIGS. 1A-1B provide an illustration of planarization metrics.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to substrate planarization. More specifically, some embodiments of the present technology relate to versatile systems and methods for precision surface topography optimization known as planarization on nominally planar substrates. In accordance with various embodiments, these techniques involve obtaining a planar-top film, in some cases conforming to the low- and mid-spatial frequency substrate topography, while planarizing the high-spatial frequency features. Various embodiments of this process are referred to herein as Programmable Adaptive Inkjetting of Nanoscale Thin-Films (PAINT) as described in U.S. Pat. No. 9,415,418 entitled "Programmable Deposition of Thin Films of a User-Defined Profile with Nanometer Scale Accuracy" which is hereby incorporated by reference in its entirety for all purposes.

PAINT uses an inkjet to dispense droplets of a pre-cursor monomer on the substrate. The substrate surface may be pre-treated to enhance the spreading of the monomer and/or for adhesion of the polymerized material. If the inkjet has multiple nozzles, the desired substrate area can be covered with the required drops in a few seconds or less with a scanning stage driving the inkjet relative to the substrate, while retaining control over the volume and location of each dispensed drop. For each desired film thickness profile, the optimum drop volumes and locations can be obtained from a model.

Following drop dispense, an optimally flexible superstrate that has been bowed with the help of backside pressure or gravity, can be brought down such that first contact on the drops is made by the front side. This initiates a liquid front that quickly spreads outward merging with the drops and thereby creates a contiguous film. This substrate-fluid-superstrate "sandwich" can then be allowed to evolve for a desired duration following which the monomer is cured by photonic or thermal energy to crosslink it into a polymer. The superstrate can then be separated from the sandwich leaving the thin polymer film on the substrate.

While it has been assumed that the superstrate is located above the substrate with the process being conducted on the substrate surface, the principles of the present technology apply to such embodiments where the relative location of the two surfaces may be reversed, e.g., the substrate may be located above the superstrate. Similarly, in the ink jetting step, it may be the substrate or the superstrate on which the drops get dispensed, depending on the relative location of these surfaces. Also, in the separation step, either the superstrate or the substrate can be moved away from the other, without changing the nature of the process. While the following discusses the substrate as having the surface which needs to be "painted," the principles of the present technology are not to be limited as such and may include other surfaces that need to be "painted."

The use of an appropriate superstrate and substrate combination is important. Generally, the properties of the substrate are invariant and cannot be changed to suit the process. Hence, typically, the superstrate properties can only be modified. However, in a general case, it is both the substrate and superstrate that affect the process dynamics, and thus, they have been presented as a combination, even though in practice, it may only be one of the two which is free to be modified relative to the other. This combination of superstrate and substrate needs to possess "optimal flexibility" where the stiffness is high enough to allow urging of the monomer drops to merge laterally rather than trapping individual drops as islands with the superstrate/substrate wrapped around them and low enough that the strain energy stored in the superstrate and substrate due to their deformation does not significantly impact the thin film fluid dynamic behavior prior to curing or crosslinking of the monomer. It should also be low enough to substantially mitigate the presence of any parasitic or undesirable topography signature and by being insensitive towards it.

In general, either the superstrate or the substrate, or both, may not be rigid, depending on the application. Flexible substrates or superstrates may include sheets, rolls or other manifestations of plastic materials, such as polycarbonate, polyethylene terephthalate, etc., as well as rolls, sheets or other manifestations of thin glass-like materials (e.g., Willow glass from Corning). However, for the sake of elucidation of the present technology, it is assumed that the substrate is rigid (e.g., a silicon wafer) and held against a chuck; whereas, the superstrate is allowed to bend and flex. The substrate may also be allowed to bend and flex without violating the basic concept behind the PAINT process.

In accordance with various embodiments, the superstrate may have a planar surface and be composed of a material, such as glass, ceramic or polymer, with appropriate thickness to render the desired flexibility. Another embodiment may include the use of a thin flexible film attached to a more rigid backing with fabricated or naturally occurring pores (such as Anodized Aluminum Oxide (AAO)). The backing can be attached to a superstrate chuck that has two vacuum zones, one, for example along an outer annulus, and one towards the inside. The control of vacuum is transferred through the porous backing to the thin film attached to it.

When the superstrate is used in the spreading step, all vacuum zones are engaged thereby allowing the thin film to be attached to the rigid backing. After spreading has been achieved, the inner vacuum zone is disengaged (or even allowed to blow positive pressure) thereby allowing the thin film to be only supported by the outer vacuum zone. This helps in substantially reducing the effective superstrate thickness (and hence, the rigidity) which is desirable in the evolution and capturing of pre-equilibrium transients (discussed further below). In some embodiments, the thickness of the thin film superstrate could be as small as 100 nm and as high as 100 μm for materials (e.g., polymers, glass, ceramics, etc.). The porous backing can have a thickness of 10 μm to 5 mm in some embodiments.

Another superstrate embodiment can be realized by having varying thicknesses at different superstrate cross-sections depending on which section of the superstrate is involved in forming the sandwich with the fluid and the substrate. This embodiment allows the superstrate thickness to be a control knob against the presence of substrate topography of varying density.

Another feature of the superstrate involves promoting the spreading and dissolution of outgassed material before curing, and then separation after curing. This typically requires the superstrate to have good wetting properties with the precursor liquid, and then dewetting properties with the post-cured polymer. Such properties can be obtained by coating the superstrate with thin films of an oxide or metal. The surface of the superstrate can also be treated.

Another step of the process is alignment which has been discussed in United States Patent Application 2017/0333940 entitled "Precision Alignment of the Substrate Coordinate System Relative to the Inkjet Coordinate System" which is hereby incorporated by reference in its entirety for all purposes.

Some representative materials that may be used as the deposited film include inkjettable compositions, such as an etch barrier solution, my-Cur from Microresist Technologies, and Monomat® from Canon Nanotechnologies. Substrates may also need to be pre-treated to tailor the wetting properties. Some materials that may be used for promoting adhesion between substrate and the deposited film include ValMat® and Transpin® from Canon Nanotechnologies.

Fluid flow in domains that have much larger lateral length scales compared to height (thin films) can be solved using the lubrication model which assumes that the flow is predominantly parallel to the surface and the perpendicular pressure gradient is zero. Typically, this leads to a nonlinear model, which can be linearized for lower computational cost and better understanding of the process mechanics. Linearization leads to a characteristic process time scale obtained as:

$$\tau_{paint} \propto \frac{\mu R^a}{D_{eff} k_0^b} \quad (1)$$

$$D_{eff} \propto \left[\frac{Eb^3}{(1-v^2)}\right] \quad (2)$$

where $h_0$ is the mean film thickness, R is a horizontal length scale, typically the radius of the deposited area, a and b are exponents depending on the exact nature of the process and $D_{eff}$ is the effective bending rigidity of superstrate (if substrate was rigid, and vice-versa), which depends on the Young's modulus, E, superstrate thickness, b, and Poisson's ratio, v. If substrate is also flexible, the effective bending rigidity would involve a combination of the two. In general, a larger value of $\tau_{paint}$ is desirable as it provides a longer time to capture the pre-equilibrium transients. From Eq. 1, a smaller $D_{eff}$ appears to lead to a higher $\tau_{paint}$. Therefore, a suitable process condition (which implies high values of $\tau_{paint}$) requires low superstrate stiffness.

This term ($\tau_{paint}$) can be used to define a non-dimensional process time (t*) as the ratio between the actual process fluid spread time ($\tau$) and $\tau_{paint}$, as $$t^* = \frac{t}{\tau_{paint}}. \quad (3)$$

The aim of various embodiments is to minimize lateral fluid re-distribution such that the final film thickness has a strong correlation with the initial material distribution so that the "programmable" nature of PAINT can be achieved by the predefined locations and volumes of the inkjetted fluid drops. In other words, the lubrication model reveals the fact that it is imperative to capture a pre-equilibrium transient state in the evolution of the sandwich because the equilibrium state allows for only one possible steady state solution (which is a flat top in the case of planarization) that is typically undesirable and is corrupted by the parasitic low-spatial frequency topography of the substrate. This defeats the purpose of the programmable deposition of thin films. This concept of "capturing pre-equilibrium transients that substantially correlates with the inkjetted fluid drops" while minimizing the effects of substrate and superstrate topography at different spatial length scales is central to the PAINT process.

In the field of planarization, when high-frequency spatial topography, such as nanoscale patterns, are present, the appropriate definition of mean film thickness, $h_0$, becomes important. This is because the need here is to overcome this high-frequency topography, while minimizing any fluid distribution because of mid and low-spatial frequency topography. Hence, the mean film thickness in equation 1, can be chosen as an appropriate average between a local maximum and minimum film thickness value. For example, the minimum film thickness can be the residual layer thickness while the maximum film thickness can be the sum of the residual layer thickness and the maximum feature height. An appropriate average can be a statistical measure of central tendency, such as an area-weighted mean, or even the most conservative bound, which in this case would be the local maximum film thickness. The definition of the mean film thickness may also involve a measure of thickness variation, such that: $h_{approx}^b \sim h_0^b + bh_0^{b-1}s$, where $h_{approx}$ is the approximate measure of mean film thickness, $h_0$ is the true mean thickness and s is the standard deviation in the film thickness. Alternatively, the overall process time constant, $\tau_{paint}$, can be kept substantially similar in areas with different pattern density by modifying the superstrate thickness.

First order properties of the model can be obtained analytically by conducting a linear analysis with $|\tilde{h}(\tilde{r},t)|=1+\tilde{\epsilon}(\tilde{r},t)$ where $\|\tilde{\epsilon}\| \ll 1$, where r is in the nominal substrate surface coordinate system. It is important to factor the presence of substantial substrate topography to not obfuscate model linearization. However, establishing a proper substrate coordinate system that accounts for the substrate topography is necessary to ensure that the linearization yields feasible results. For example, a result of the linearization in the presence of patterns or high-spatial frequency substrate topography leads to the presence of the term, s, or standard deviation, in the definition of the approximate mean film thickness.

The linearized model can be solved analytically thereby drastically reducing computational complexity and allowing for a key aspect of PAINT to be solved: optimal locations and volumes of fluid drops for a desired film thickness profile. In one embodiment of the process, only drop locations may be optimized while keeping drop volumes fixed to the minimum volume dispensed by the inkjet. Also, if the low-spatial frequency topography is substantially similar across different wafers, it need not be measured every time. In one embodiment of the process, optimum drop volumes and locations can be obtained from an inverse optimization scheme around the lubrication model without any input for low-frequency nanotopography, particularly if the non-dimensional process times are low. In another embodiment of the process, the optimum drop volumes and locations can be obtained from an inverse optimization scheme around images captured in real time from the process. In another embodiment, a hybrid approach can be chosen wherein the lubrication model is augmented with a real-time data-based, statistical, or empirical model.

In addition to the inverse optimization for an optimum film thickness profile based on process mechanics, an important aspect of the PAINT process involves a wrapped functional optimization scheme. The purpose of the functional optimization scheme is to correlate the desired film thickness with desired functional performance of the process and substrate. For example, in semiconductor planarization, it may be important to ensure that the planarizing film eventually does not become anti-reflective or possess other desired optical properties. The computational cost of this higher-level constraint may slow down the inverse optimization scheme, and based on how high the computational cost is, an approach can be taken where optical performance calculations are undertaken intermittently, at a frequency that is not computationally cost-prohibitive, rather than for each sub-optimal film thickness profile obtained while performing the optimization. It may also be important to ensure that the thickness of the planarizing film does not interfere with subsequent etch-back.

Various embodiments of the present technology provide for a wide range of technical effects, advantages, and/or improvements to computing systems and components. For example, various embodiments include one or more of the following technical effects, advantages, and/or improvements: 1) Global (or near-global) planarization in the presence of nanoscale features; 2) integrated use of optimization and inverse optimization techniques to identify customized drop patterns; 3) automated in-situ hotspot detection and mitigation integrated into fabrication workflow; 4) use of customized algorithms for planarization; 5) cross-platform integration of machine learning to more efficiently identify hotspots and corresponding hotspot mitigation solutions; and/or 6) system design for enabling high-throughput planarization with high yield, through innovations in the (i) design of the superstrate, (ii) handling of the superstrate and substrate, (iii) UV-curing mechanisms, (iv) techniques for separation of the substrate and the superstrate, (v) parallel processing of multiple substrates on the same tool.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

Planarization Performance

Planarization is a key process step in the field of semiconductor device fabrication. By maintaining depth of focus within the desired lithographic tolerances, it enables photolithography on multiple planar layers to be executed without loss of feature resolution. Its use is prevalent in both front-end semiconductor device processing of transistor circuits as well as back-end semiconductor device processing applications such as packaging of fabricated circuits. The process requirements may vary depending on the underlying pattern and desired process performance—however, some common aspects of the use of inkjets for achieving such planarization have been described below.

The performance of a planarization process is generally captured in two metrics: (i) degree of planarization, and (ii) planarization length. The degree of planarization represents the extent to which a step pattern is planarized, and is quantified as the difference in the step height before and after planarization. Planarization length represents the distance at which a certain degree of planarization is achieved.

Figure 1B:
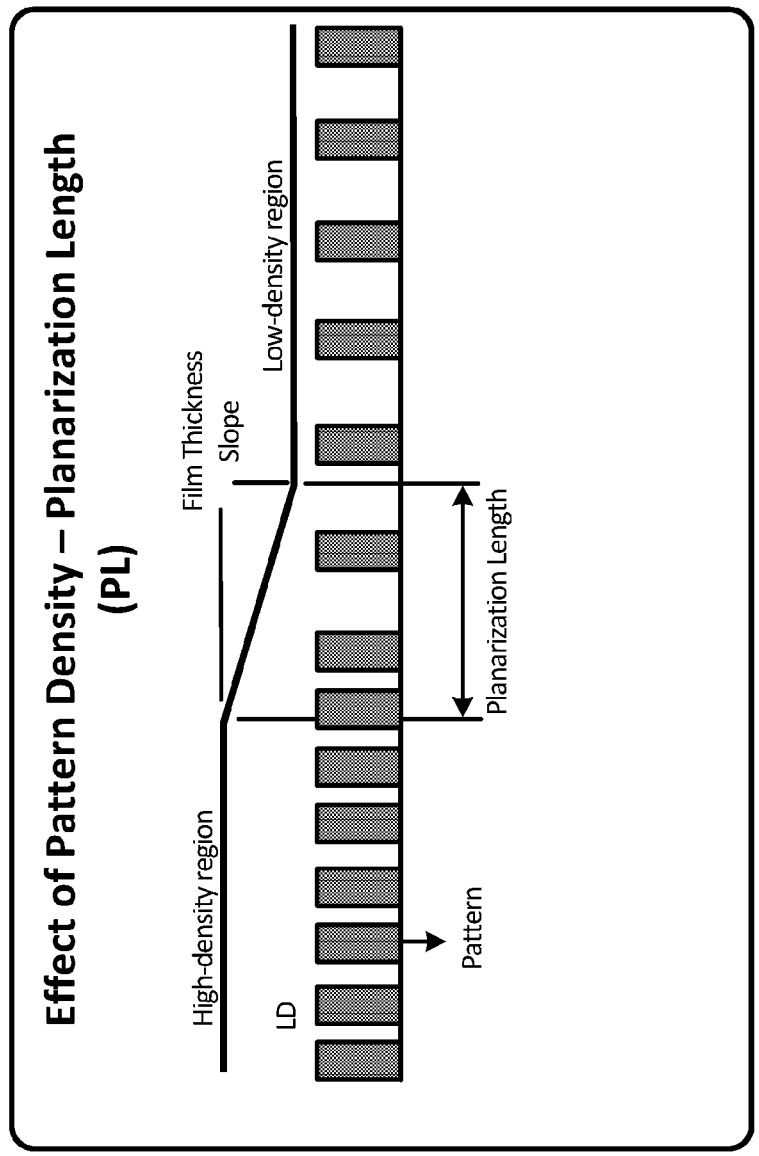

FIGS. 1A-1B show these two metrics and how they relate to the planarization process. The ideal process achieves 100% degree of planarization at Infinite planarization length, to achieve what is known as global planarization. However, existing processes are not ideal and fall short of achieving global planarization. For example, spin-coating can only achieve what is called smoothing (i.e., extremely short planarization lengths of the order of the feature pitch).

Chemical-mechanical planarization (CMP), which is the semiconductor industry workhorse today for planarization, can typically achieve only local planarization, (i.e., planarization lengths that are of the order of the die and heavily dependent on the density of the pattern in the die). For example, in the CMP process, the dependence of planarization performance on pattern density necessitates the use of techniques such as dummy fill, which consists of fabrication of a non-functional pattern with the same density as the functional pattern. Fabrication of this non-functional pattern adds to the complexity of the photolithography process and can also be detrimental to the electrical performance of the integrated circuit (IC). Moreover, at current semiconductor fabrication technology nodes of 14 nm and below, where the photolithography process is already highly complex (e.g., utilizing double- and quad-patterning techniques), substantial savings can be achieved if the need for dummy fill can be avoided without compromising planarization performance.

To this end, the primary goals of some embodiments of the planarization process discussed in this disclosure are:
1. Global (or near-global) planarization in the presence of varying features (e.g., varying density, pitch, feature size, etc.), and
2. Compatibility with existing lithographic processes at both the front- and the back-end.

These goals can be achieved by optimizing both the software and hardware behind the PAINT process.

Planarization Parasitics

The ability of the PAINT process to achieve near-global planarization can be corrupted by the presence of several parasitic phenomena or factors ("parasitics"). One of these parasitics is shrinkage of the UV-curable monomer used for the planarization process upon polymerization. The amount of shrinkage of the monomer depends on the geometry of the underlying features. For example, the polymerized film will undergo less shrinkage over a narrow trench compared to the film shrinkage over a much wider trench.

In some embodiments of the current technology, this parasitic can be obtained using classical thin film shrinkage models derived from the theory of elasticity and viscoelasticity of polymers and used to obtain the optimum drop volumes and locations. In other embodiments, this parasitic is obtained using experiments and used to obtain the optimum drop volumes and locations. Further, a multi-step planarization process can be used to overcome this parasitic and obtain desired planarization performance, wherein a first planarization process leads to moderate planarization performance and one or more subsequent steps are needed to obtain higher planarization performance.

Figure 2:
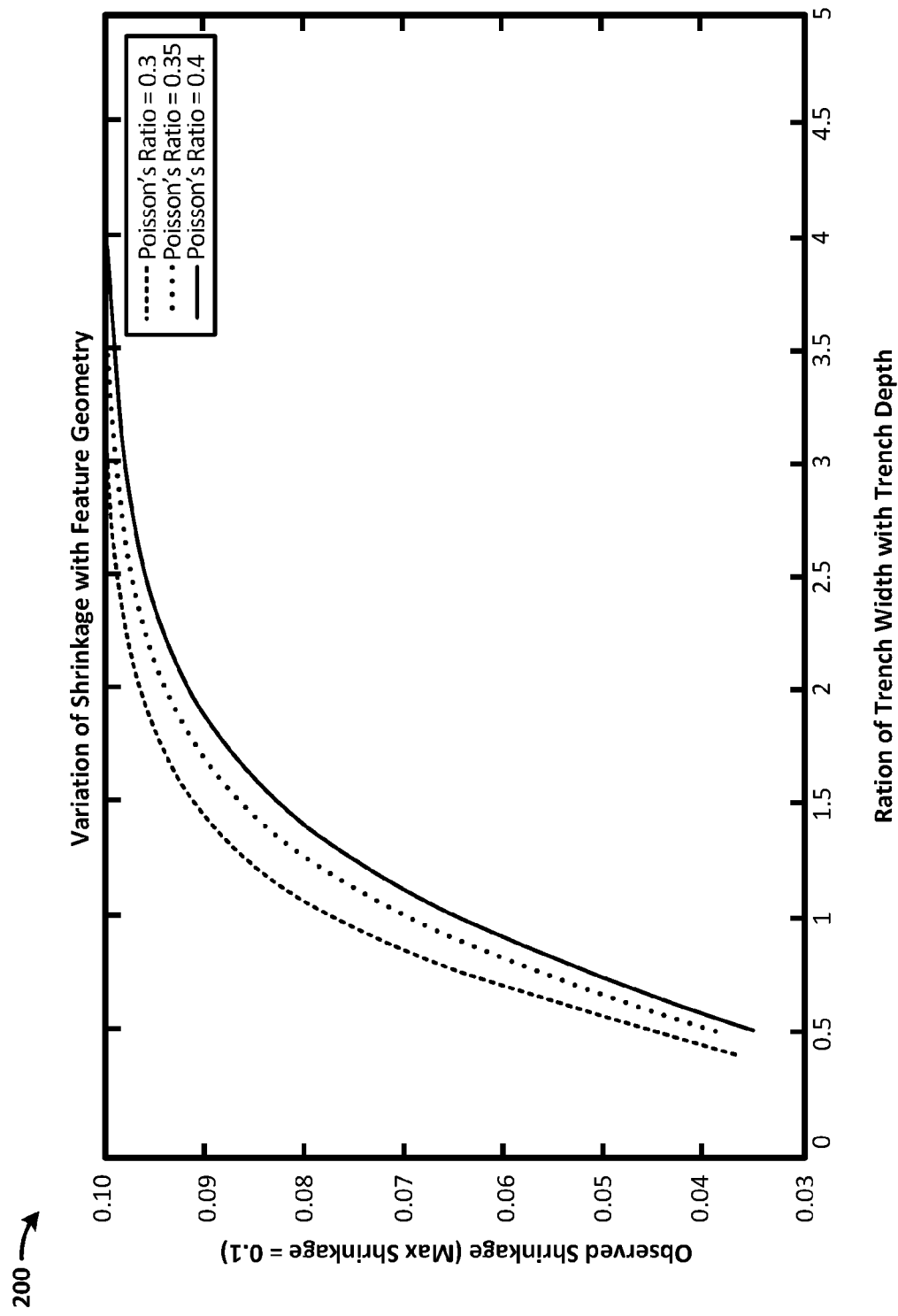
FIG. 2 is a plot illustrating variation of shrinkage with geometry.

The bulk shrinkage characteristics can be obtained from experiments on unpatterned substrates and can be used as a parameter when obtaining shrinkage over features. An example of the variation of shrinkage with feature geometry is given in FIG. 2. In plot 200 in FIG. 2, the x-axis indicates the width to depth ratio of a generic trench (i.e., width/depth), and the y-axis indicates the fraction of observed shrinkage upon polymerization of a thin film covering the trench, assuming that the maximum shrinkage in the absence of any trench is 0.1 (i.e., 10%). Here the shrinkage, S, of a thin film with initial thickness $t_i$, and final thickness $t_f$, is defined as $S=1-t_f/t_i$.

Another parasitic effect that can affect the planarization performance is the presence of pre-existing films of different materials on the pattern that may be deposited using a variety of processes such as spin-coating, vacuum deposition, etc. Each of these processes introduces undesired variations in the thicknesses of the corresponding films that they deposit and thereby change the final pattern that needs to be planarized. It is important to have a robust model of these processes in the presence of different patterns, or obtain the final pattern information experimentally. Having robust computational or analytical models of these thin film deposition processes in the presence of patterns or having experimental data from these processes would allow the parasitics to be compensated for. For example, spin-coating of an adhesion layer to promote the spreading and merging of inkjetted drops may be necessary prior to the planarization step.

As discussed above, spin-coating may result in smoothing of features, which causes any sharp edges or corners to lose their sharpness. Spin coating may also cause the side wall angle of features to become more relaxed (i.e., less steep), which changes how the inkjetted drops behave or flow on the pattern. It is important to capture this effect for spreading of drops to form a contiguous film. In some embodiments, the effect of such pre-processing and post-processing steps on the planarization performance is compensated for by placing drops with optimal volumes at optimal locations. In one embodiment, the effect of such pre-processing and post-processing steps on the planarization performance is determined using experiments. While the above discussion has been confined for thin film deposition processes, other exemplar pre-processing (upstream) steps include CMP, etch, wafer dicing resulting in wafer thickness variation, etc., while exemplar post-processing (downstream) steps include etch, CMP etc.

In general, the goal of the planarization process is to obtain a desired level of planarization performance. If this goal is achieved computationally through an optimization routine, it may require an objective function that can be a combination of a desired planarization length and desired degree of planarization. In various embodiments, the desired planarization performance metrics are substantially similar across the substrate. There can, however, be instances when the planarization performance is tighter in certain local areas, or sub-regions of a die, where each die is a device, because of higher lithographic resolution or other process constraints in that sub-region. There may be as many as 50 to 50,000 dies in a wafer, where the dies may or may not be identical. In such instances, the planarization performance requirements can be increased for these sub-regions, thus adapting the goal of the planarization process spatially from one sub-region to the other within the same process step. In one embodiment, this can be done by appropriately modifying the objective function to minimize a weighted error of the actual planarization performance against the desired planarization performance, where the weights are higher in areas that need more accurate planarization performance.

If there is a need to manage computational expense, the increase in performance requirements in these sub-regions can be compensated by reducing the performance requirements in other sub-regions where the yield is acceptable and yield problems are not anticipated by changing the desired metrics. The compensation or enhancement of the desired planarization performance may also be linked with the incoming pattern geometry, such as the pattern GDS file. In one embodiment, the goal related to planarization performance can be spatially variant, where the spatial variation source may be the incoming pattern information or prior information about defect hot spots, where hot spots are defined as areas with undesirable planarization performance, or yield loss.

Model-Based or Experimental Prediction of Drop Spreading

The formation of a continuous film on a patterned surface precedes the evolution of the thin liquid film described earlier, and predicting drop spreading can be done using either model-based techniques or through experiments. The ensuing discussion is primarily focused on model-based prediction, with the caveat that experimental data can be used to support the models or used on their own. In one embodiment, understanding how individual drops merge can be supported by analytical, empirical or statistical techniques, including a combination of one or more of these methods. Analytical methods solve for the dynamics of one or more drops simultaneously as they are squeezed under the action of the superstrate. The dynamic behavior of these drops may include phenomena such as wetting, evaporation, etc.

The presence of a patterned substrate modifies the wetting and spreading behavior of these drops compared to a flat substrate. On a substantially flat substrate, the wetting of drops would be substantially continuous. However, the presence of a pattern can introduce discontinuities in the motion of these drops, as discussed in "Dynamics of low capillary number interfaces moving through sharp features, Physics of Fluids 17, 122104 (2005)" which is hereby incorporated by reference in its entirety for all purposes. These discontinuities arise from the pinning of the contact line, i.e., the interface between the liquid drops and the ambient environment, on substantially sharp corners of these features. Pinning of the contact line is also known as hysteresis.

As discussed earlier, with earlier process steps such as spin-coating, some of the features may lose their sharp corners and have relatively less steep sidewall angles. This would allow the contact line to navigate these corners more easily with assistance from gravity, and would thereby minimize the influence of contact line pinning. In one embodiment, the determination of contact line pinning is complemented with thin film evolution and is done by analogy with the phenomenon of friction and backlash in mechanical systems. This stick-slip behavior can lead to a delay in the onset of motion in the presence of an external force, which for the drops is a combination of gravity, capillarity, inertia and viscosity. Some embodiments take advantage of the lack of hysteresis from features that do not have substantially sharp transitions. Such smooth transitions can be obtained if one or more spin-coating steps are carried out prior to the PAINT process.

The material that is spin-coated can be substantially similar to the planarizing material, or can be a functional material that (i) improves adhesion of the underlying substrate or film with the planarizing material (e.g., Transpin), (ii) provides necessary optical, thermal or process characteristics such as etch resistance (e.g., spin-on Carbon). If spin-coating is not feasible, a multi-step PAINT process can be executed wherein the desired planarization performance is achieved in multiple steps rather than a single step. This is particularly useful when the planarization requirements vary substantially across the substrate, or if substantially high aspect ratio features need to be planarized, or if undesirable process parasitics such as shrinkage causes an undesirable loss in process performance, or if stringent yield requirements necessitate a substantially robust process operating window. Each PAINT step can be followed by etch back (see, e.g., U.S. Pat. No. 8,394,282 entitled "Adaptive Nanotopography Sculpting" which is hereby incorporated by reference in its entirety for all purposes) if the overall film thickness becomes too large as a result of multi-step PAINT process.

Stick Slip Behavior of Drops

In the absence of any features, the contact angle of drops sitting on the substrate would be given by the bulk contact angle of the liquid, assuming that the characteristic lateral feature dimension is much smaller than the diameter of the drop (less than $10\lambda$). In the presence of features, the equilibrium contact angle is also governed by the pattern geometry (or a roughness factor which incorporates pattern geometry information). This pattern geometry may make a wetting drop more wetting (Wenzel state), or may transition into a Cassie-Baxter state, where the drop may be substantially hydrophobic (see, e.g., Wetting and Roughness, David Quéré, Annual Review of Materials Research 2008 38:1, 71-99 which is hereby incorporated by reference in its entirety for all purposes). While hydrophobicity is undesirable as it may lead to the drops not wetting spontaneously and may arise if the substrate features are deep, it allows drops to be moved more easily, should there be a need to improve location accuracy.

In one embodiment, such movement of drops can be facilitated using methods such as acoustic vibrations or shape modulation of the substrate through an array of piezoelectric actuators (see, e.g., U.S. Pat. No. 7,307,697 which is hereby incorporated by reference in its entirety for all purposes), thermocapillary motion in the presence of temperature gradients on the substrate, or by a precisely controlled tip/tilt of the substrate. This is because hydrophobic drops tend to levitate themselves on the top of features without penetrating.

Figure 3:
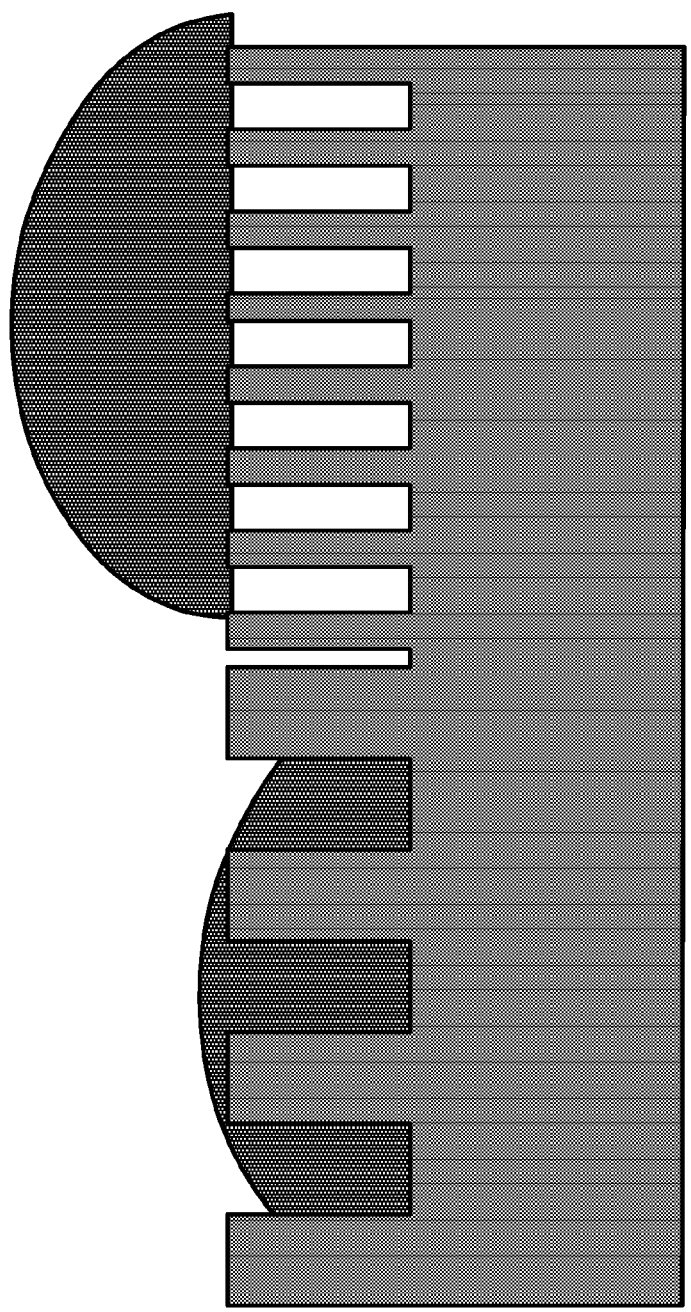
FIG. 3 illustrates an impaled (penetrating) drop versus levitating drop.

On the other hand, hydrophilic drops can impale themselves inside the features, which would make them "stick" to the features, as shown in illustration 300 in FIG. 3. The transition from the levitated to the impaled state is a function of the pattern geometry, material of the substrate as well as any applied pressure on the drops (see, e.g., Impalement of fakir drops, M. Reyssat, J. M. Yeomans and D. Quéré, 20 Dec. 2007, EPL (Europhysics Letters), Volume 81, Number 2 which is hereby incorporated by reference in its entirety for all purposes). Hence, in areas where there is a transition from one feature density to another, the drop stick slip behavior can be widely different. In some embodiments, it is desirable to have the drops substantially stick to the features to prevent undesirable drop migration.

In one embodiment, the drop behavior in this transition region can be checked by first applying pressure using the superstrate to cross the threshold pressure needed for drop impalement, and then retracting the superstrate. This retraction does not pull the drops out as they substantially stick to the substrate. The drops that have not impaled and still slip on the substrate can be then moved. This process can be repeated a few times to get the drops to the desired locations. Alternatively, a multi-step planarization process can be carried out that mitigates the parasitic error from one step to the next, especially since the pattern is substantially smoothened after the first step, which prevents any undesirable drop migration.

Another manifestation of modified drop wetting behavior occurs through drop anisotropy, particularly, in the presence of substantially unidimensional features such as lines and spaces. In this situation, the drops may preferentially spread in one direction (along the lines), versus another direction. In one embodiment, the equilibrium elongation ratio of individual drops dispensed on such features can be determined through analytical formulations or experimental data and can thus help determine drop spreading (see, e.g., Anisotropic Drop Morphologies on Corrugated Surfaces, H. Kusumaatmaja, R. J. Vrancken, C. W. M. Bastiaansen and J. M. Yeomans, Langmuir, 2008, 24 (14), pp 7299-7308 which is hereby incorporated by reference in its entirety for all purposes).

In the presence of anomalous drop behavior, such as anisotropic spreading or stick-slip, a multi-step planarization process can be conducted, where the planarization performance substantially improves from one step to the next. The first planarization step would substantially fill the features and smoothen the discontinuities that lead to anomalous drop spreading. This would enable the planarizing film in subsequent steps to encounter features with substantially reduced anisotropies, or "rough" pattern geometries that lead to contact line pinning. This relatively smooth topography of the substrate can then be measured and planarized substantially in the next planarization step.

Computational Modeling

The analytical approaches described earlier rely on modeling of individual drops. These analytical models can be simulated using tools such as Molecular Dynamics, Lattice Boltzmann techniques or numerical solutions of the Navier Stokes equations. In typical planarization scenarios, several tens of thousands of drops may be dispensed, which would require the use of substantial computational horsepower to solve for the spreading and wetting behavior of individual drops to form an initial film. While such computational resources can be made available in the form of supercomputers or clusters of servers, there can be situations where such resources are not available. In such scenarios, the use of analytical models can be augmented with empirical and statistical techniques. These techniques can either rely on experimental data alone or can combine analytical insight from the modeling of a few drops with experimental data to develop statistically relevant models to describe the behavior of several drops in the presence of a substrate pattern.

Statistical relevance can be determined with the help of methods in uncertainty quantification, such as Bayesian statistics, confidence intervals, etc. The choice of the relevant model (analytical, empirical or statistical) as well as the number of parameters in each model can be based on the desired accuracy and precision requirements. These precision requirements may not be spatially uniform and may be stricter in areas where there are transitions in the substrate pattern, for example. In one embodiment, the determination of an initial film from several drops is done with the help of an empirical technique that models each drop as a disk with a height and radius commensurate with the volume of the drop. This is useful for situation when the drop volumes are lower than 1 pl and the drops are highly wetting.

The curved sidewall of the disk may not be perfectly steep and may be modeled as having a slope. Further, the sidewall profile may be described by other functional representations, including trigonometric series, polynomial series, step functions, error functions etc. In each of these representations, the choice of the number of parameters is important and can be tuned based on the desired accuracy of the result. The trade-off will be computational expense given that adding more parameters will lead to longer times for calculating the result. In one embodiment, a substantially accurate representation can be chosen for an initial offline calculation, whereas a representation with lower number of parameters can be chosen for subsequent or real-time calculations.

The inverse optimization scheme may rely on an input of the desired film thickness and starting substrate topography. For high-throughput planarization where the process times are less than 10 seconds and with a sufficiently optimal superstrate, the global substrate topography may not contribute much to the thin film evolution of the superstrate-fluid-substrate sandwich. This implies that the computational model may not incorporate the global substrate topography as an input which precludes the need to measure this topography in every wafer that is planarized.

The computational model may have the ability to linearize or reduce the complexity of the nonlinear thin film fluid model which governs the behavior of the fluid trapped between two plates. Linearization relies on small changes in film thickness across the area of the substrate, and typically involves having a mean film thickness defined as a characteristic length scale of the film thickness. In the presence of a substrate pattern, the film thickness undergoes drastic changes locally. This complicates linearization, where the mean film thickness is no longer an accurate measure of the characteristic film thickness. The mean film thickness may need to be augmented with additional terms such as a film thickness variance given by the standard deviation of the film thickness.

The optimization scheme relies on minimizing an error between the actual and desired film thickness. For small process times and where there are strict requirements for having no voids, the error metric may be expanded to also include the presence or absence of voids, number of voids exceeding a tolerance size, total area of voids, or a combination of the previous. Because the error can be high for planarization when the linearization of the full nonlinear model is not accurate, it is also important to conduct a simulation of the full nonlinear model with the optimum parameters generated by the inverse optimization scheme with the linearized model.

Bubble Mitigation

A key problem in the merging of resist drops while forming a contiguous film is that of bubble mitigation. The presence of such bubbles and voids may cause defects in the final planarized film, and can happen if any gases trapped in the bubbles are not expelled through the substrate or the superstrate because of low porosities. This is also a problem in areas where drops may be placed far apart from each other because of film thickness and underlying feature constraints. Mitigation of bubble trapping may be achieved by increasing the time that the drops take to merge or by providing an environment with gases such as $CO_2$ that can dissolve quickly through the resist and the two surfaces in contact with the resist.

Accuracy and Precision of Inkjets

One of the key aspects of PAINT is the determination of thin film fluid evolution between a substrate and a superstrate where the thin fluid film is formed using individual drops. In this disclosure, an embodiment of the PAINT process is discussed which involves the substrate having nanoscale features. The thin film evolution, and any model for the same, is dependent on a measure of the film thickness which defines the relevant process time scales. Some embodiments can use a variety of film thickness values for different areas of the substrate, given that the presence of patterns changes the film thickness value locally. This will be in accordance with the accuracy requirements for planarization of different areas of the substrate.

This can be augmented with the ability to partition the substrate into various domains, with each domain having a well-defined averaged film thickness value that substantially correlates well with the tolerance and accuracy requirements at that location. Since the underlying substrate can have substantially similar patterns on several substrates, the domain partitioning can also be hard-coded in the superstrate design by having different superstrate thicknesses at different locations that also correspond to increasing accuracy requirements. For example, in pattern density transition areas, i.e., areas where the pattern density changes substantially, it might be beneficial to have higher accuracy requirements to address this pattern complexity. At the same time, the inkjet may also introduce inaccuracies in the film thickness evolution through imprecise jetting of drops on the substrate given by the inherent variability of the inkjet printhead.

Typically, this variability is manifested as the precision of drop placement with respect to a perfect grid. This precision is higher in the direction along the printhead, i.e., the direction along the row of inkjet nozzles, and is lower in the direction perpendicular to this. Hence, areas that have higher accuracy demands during the planarization process may need more precise inkjetting which can occur substantially along the direction of the row of nozzles. This can be achieved by orienting the substrate such that these critical areas are substantially aligned along the direction of the inkjet nozzles. Such orientation and alignment can be achieved using an appropriate rotation stage with the wafer chuck and is enabled with prior knowledge of the substrate pattern. Techniques to achieve precise orientation and alignment of the substrate with respect to a coordinate system have been discussed in U.S. Patent Application 2017/0333940 entitled "Precision Alignment of the Substrate Coordinate System Relative to the Inkjet Coordinate System" patent discussed above. In a similar vein, some embodiments may have more analog control on the inkjetted drop volumes at certain locations.

For example, in a typical inkjet, the dispensed drop volume is an integer multiple of the inkjet drop resolution. Thus, if the inkjet drop volume is 6 pL, then the inkjet is capable of dispensing drops of volumes 6 pL, 12 pL, 18 pL, and so on. This leads to discrete changes in the drop volume that may prevent the achievement of the level of precision desired in said critical areas. In this regard, in one embodiment, it is desired to have the ability to have more analog control over the inkjetted drop volumes (e.g., 6 pL, 7 pL, etc.) in such critical areas, in order to obtain a more desirable initial film thickness profile that may substantially correlate with the final film thickness profile.

This would imply that the overall inkjetting drop volume resolution can be different from the minimum drop volume from the inkjetting system. This analog control may be achieved using one or more representations described herewith. In a representation of this embodiment, a single inkjet array is used wherein the waveform is modified when dispensing drops in the vicinity of these critical areas to obtain the desired analog control on the inkjet drop volumes and velocities, and hence, the placement precision and accuracy (see, e.g., Synder et al, "Automated tuning of high-order waveforms for picoliter resolution jetting of rheologically challenging materials," Precision Engineering, available online at http://www.sciencedirect.com/science/article/pii/S0141635918300114 which is hereby incorporate by reference in its entirety for all purposes). In another representation of this embodiment, the inkjetting system may consist of more than one array of inkjet nozzles, with each array of inkjet nozzles calibrated to a different drop volume resolution and minimum drop volume. In another representation, the above two approaches can be combined. In another representation, a nozzle or a set of nozzles in each head identified with the highest precision is used in areas with high accuracy or precision requirements.

A multi-nozzle printhead is typically aligned along a single direction of the substrate. This implies that the precision of inkjetting is typically higher in the direction that is parallel to the row of nozzles. This situation is beneficial when the planarization process is carried out in response to scanning photolithography as a downstream process. Planarization errors in the direction parallel to the scan direction can be tolerated to a much greater extent than errors in the cross-scan direction. Scanning photolithography can substantially tolerate surface topography errors that look like surfaces of extrusion. This implies that any cross-section of the surface along the scan direction is substantially similar to a different cross-section of the same surface along the cross-scan direction. Hence, if the inkjet nozzles are aligned parallel to the cross-scan direction, higher precision can be obtained in that direction. In general, the implication here is that if scanning photolithography is a downstream process to planarization, the accuracy requirements may be substantially higher in one direction compared to the other, as shown in FIG. 4.

Figure 4:
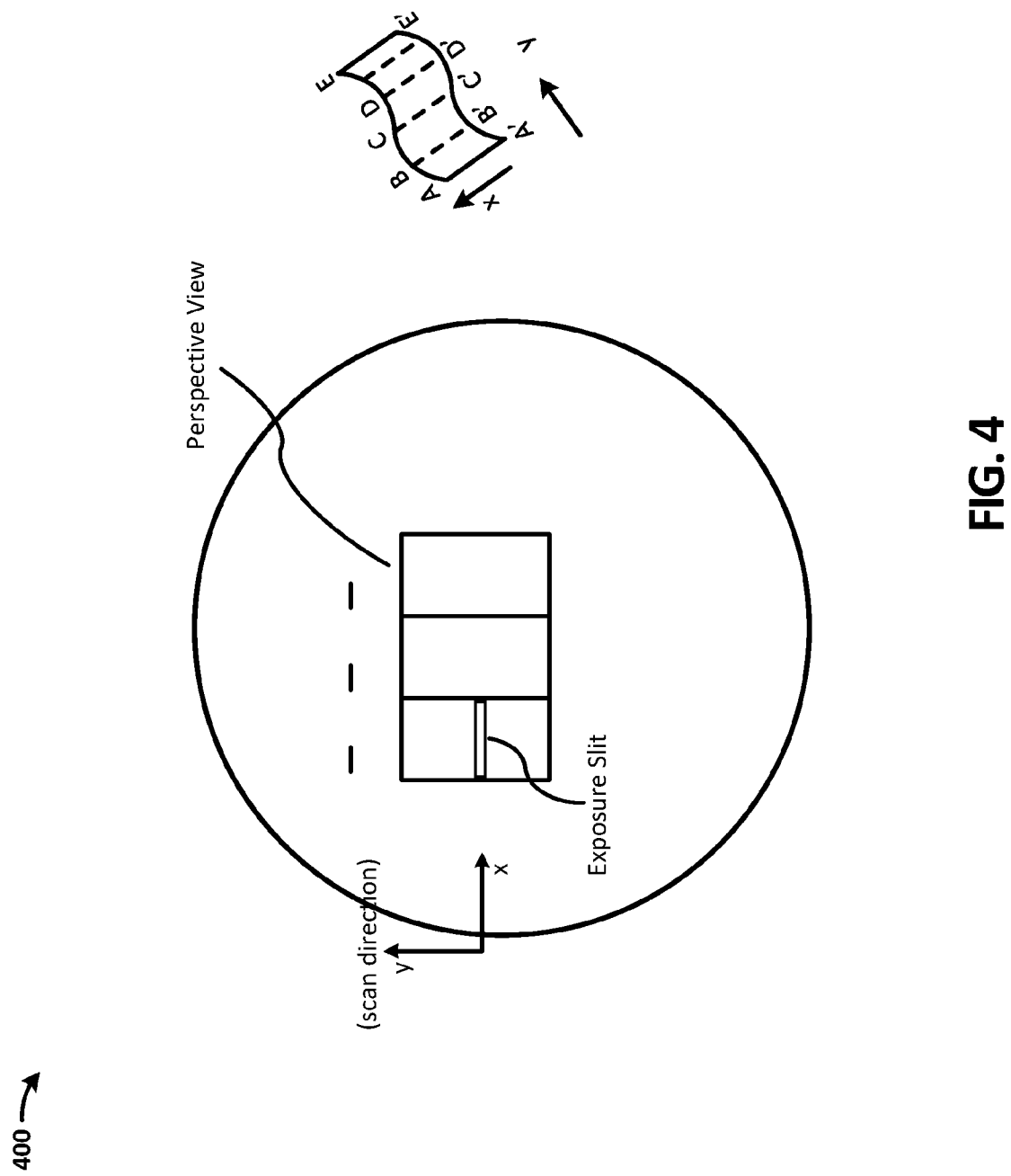
FIG. 4 illustrates an example of planarization for scanning photolithography depicting that planarization performance that is substantially more accurate in the x direction rather than the y direction. according to one or more embodiments of the present technology.

FIG. 4 illustrates planarization 400 for scanning photolithography depicting that planarization performance should be substantially more accurate in the x direction rather than the y direction. In other words, the substrate profile cross sections AA', BB', . . . , EE' are substantially close to being linear, whereas the lines ABODE and A'B'C'D'E' may not be substantially linear while remaining substantially parallel.

Controlling Drops and Contiguous Thin Film State

The achievement of high drop location accuracy and precision is an important requirement for the PAINT process when it comes to planarizing substrate topography. This is because the behavior of drops on a patterned substrate is influenced by where the drops are relative to the pattern geometry. As discussed earlier, drops may exhibit contact line pinning, levitation, or impalement based on their interaction with the patterned substrate. As long as this behavior is consistent across different substrates, it can be incorporated as a feature to obtain drop volumes and locations. This can be done through precise experimentation by using a send-ahead wafer that can provide information about systematic hot spots or areas with repeatable but undesirable planarization performance. These systematic hot spots may also be determined from a simulation of the system or from a combination of simulation and precise experimentation using the send-ahead wafer. These systematic hot spots may be caused (but not limited to) by the following mechanisms: unexpected flow asymmetry (may come from a pattern on the substrate, contact line pinning, anisotropic features such as gratings), inaccuracies in drop volume, drop location, error in aligning superstrate with substrate, shrinkage, evaporation, etc.

Hot spots can be detected in an experimental system using AFMs/AFM arrays that are specifically configured to address them. However, if there are random hot spots, such as drops on one substrate that are substantially pinned, whereas they are not on a different substrate, there may be inaccuracies that may compromise planarization performance. In order to achieve the desirable drop location and volume precision and accuracy, a few different strategies can be employed. One strategy can be the use of partial vacuum in the vicinity of the drops that need to be modified. The use of partial vacuum can change the volume of the drops locally as well as induce displacements on the substrate, including overcoming contact line pinning.

A partially evacuated or pressurized environment can also be used to enhance or inhibit evaporation of the dispensed drop to further control its volume or location or wetting angle, which is governed by contact line hysteresis on patterned surfaces. The partially evacuated or pressurized environment has been used to control undesirable effects from evaporation and can be done with the help of solvent vapor. This can also be used when the drops have merged into a contiguous film. The ambient environment can be controlled to influence parasitics such as evaporation from the open sides of the superstrate-fluid-substrate sandwich. A complementary strategy can be the use of a single or an array of individually addressable air jets, preferably on top of the superstrate or below the substrate after formation of the contiguous film. The extra air pressure from these air jets can locally deform the superstrate or substrate, thereby effectively providing a control knob for controlling the flow of the contiguous film.

A combination of air pressure and vacuum can also be used in the form of a pressure zone chuck, an embodiment of which is disclosed in U.S. Pat. No. 6,982,783, which is hereby incorporated by reference in its entirety for all purposes. This zone chuck can be used to control the transient, relative shape or curvature of the substrate and the superstrate, such that drop merging and spreading is coerced and does not lead to trapping of bubbles or voids between initiation of contact and achievement of substantial conformality between the substrate and the superstrate.

Figure 5:
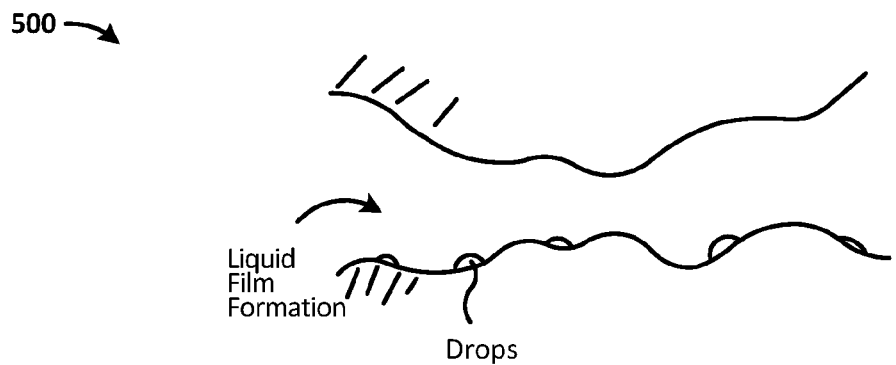
FIG. 5 illustrates different drop spreading scenarios showing the desired relative shapes or curvatures of the superstrate and the substrate.
Figure 5:
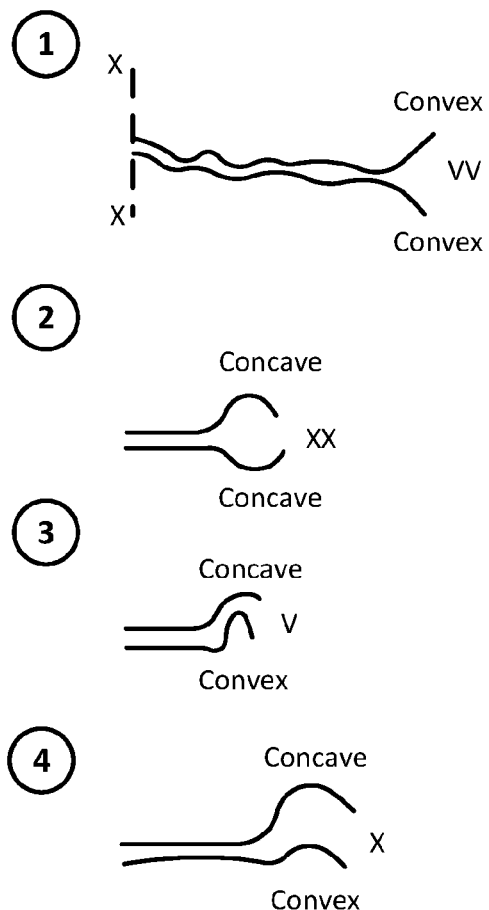
Figure 5:
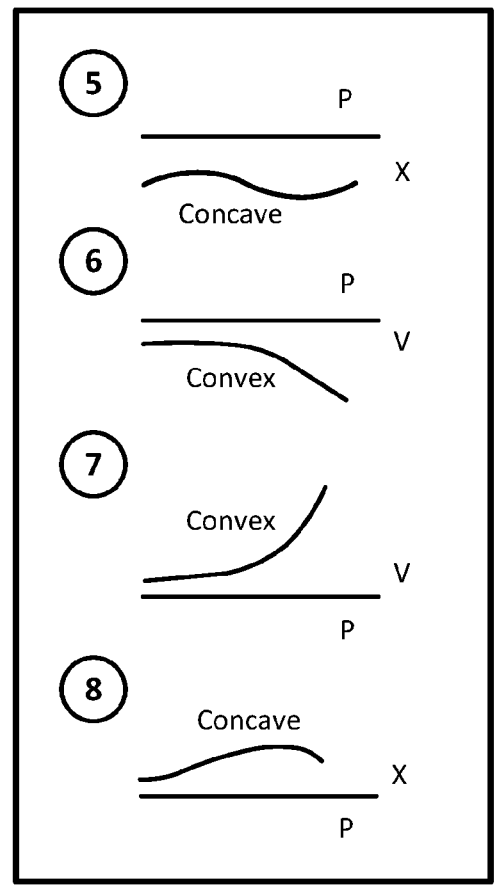

Different relative shapes or curvatures 500 of the substrate and the superstrate have been illustrated in FIG. 5. The best case scenario is a substantially convex superstrate and a substantially convex substrate. If one of the two surfaces is substantially concave or flat, it is desirable to have the other surface substantially more convex. This shape control becomes especially relevant when drop spreading and thin film formation occurs in regions of inflexion on the superstrate and substrate, such as areas where there is substantially fixed contact of one surface with its respective chuck, such that shape control on the other surface overcomes this inflexion and allows drop spreading and thin film evolution with substantial bubble mitigation.

Another strategy can be the use of controlled thermal energy. The use of heat can partially evaporate the drops to change their volumes while the use of acoustic energy can displace them locally to meet drop precision requirements, or it can influence thin film flow after formation of a contiguous film. The thermal energy can be provided from the substrate through a set of individually addressable micro-heaters on the substrate (see, e.g., the highly precise thermal actuation and temperature control is shown in United States Patent Application 2017/0131640 which is hereby incorporated by reference in its entirety for all purposes), or through localized infra-red radiation focused through the superstrate using spatial light modulators such as digital micromirror devices (DMD).

Alternatively, the superstrate can also be designed to have a layer of a transparent conducting electrode or a metal nanoscale mesh pattern that can heat the superstrate when supplied with electric current. The heat can be transferred to the drops or the contiguous film on the substrate thereby allowing them to move through thermocapillary effects or to evaporate to modify the volume. The transparent electrode or the metal mesh pattern is substantially transparent, and does not block the UV exposure through the superstrate. The use of electrical energy directly can also lead to displacement of individual drops or thin film flow through a phenomenon called electrowetting. This requires the use of an electrode pattern on the superstrate which is then coated with a transparent dielectric that is eventually in contact with the drops or the film. In this disclosure, the concept of controlling the individual drop volumes, either in flight or on the substrate or by modifying the piezo inkjet waveform, is called analog drop volume control.

The drop location accuracy can also be improved by bringing the substrate closer to the inkjet. The metrology of drops on the substrate can be done by aligning the drops against a precise X-Y grid and by imaging them on the substrate to determine drop locations and volumes prior to contact with the superstrate. Imaging across a full wafer, especially with 300 mm diameter, with sufficient resolution may lead to prohibitively expensive or cumbersome optics given that this step needs to occur quickly to enable a sufficiently rapid transition to superstrate contact. Hence, the metrology can be prioritized for areas where there are known yield issues or where process yield problems have been anticipated. Coarse metrology may be done for the rest of the wafer.

Superstrate Design

The presence of nanoscopic features on the substrate with steep slopes and varying densities can complicate the evolution of a thin contiguous film of liquid sandwiched between the superstrate and the substrate. If model-based prediction is involved, it can become highly nonlinear and computationally expensive, which is why it may be desirable to linearize and simplify the model. The model can thus be augmented with empirical experimental evidence to determine the optimum geometric parameters necessary for a superstrate.

For example, the superstrate thickness can be determined, based on a norm of the film thickness, where the norm can be a 2-norm, an infinity-norm, etc. This superstrate thickness can be validated against experiments to determine the optimum value based on defined planarization metrics. In another embodiment, the substrate which needs to be planarized may be patterned with features that are substantially larger than the nanoscale features typically seen in semiconductor planarization. This is because thin film lubrication defines an approximate spatial wavelength below which the fluid will substantially planarize and above which the fluid may conform to the underlying topography. Hence, any features that are smaller than this critical wavelength need not be patterned for the tests to determine optimum superstrate thickness, for example. In this embodiment, test wafers or send-ahead wafers are patterned with substantially larger features without compromising the planarization performance. This will enable testing of planarization performance at substantially lower cost given that it is much cheaper to fabricate substrates with micro-scale features than substrate with substantially smaller, nanoscale features.

The superstrate's thickness is a key process parameter that defines the performance of this planarization process. This is because the superstrate's thickness has an exponential influence on the time that it might take for the liquid film to planarize the features. Hence, any variation in the thickness of the superstrate can induce a substantial variation in the planarization performance, given that process times are generally fixed by throughput or other constraints. It thus becomes imperative to ensure that any undesirable variations in the thickness of the superstrate are minimized. The choice of thickness variation tolerances can be determined from the allowable tolerances in process times.

Alternatively, the thickness variation in the superstrate can be measured to a high degree of accuracy prior to executing the planarization process. This spatial thickness variation can be incorporated in a model or experiment to minimize any parasitic behavior during the process. In one embodiment, the total thickness variation of the superstrate is kept within sufficient tolerances such that the bending stiffness variation is within 10% of the desired stiffness variation, which is inversely proportional to the time it takes for the liquid film to planarize the features. In one embodiment, the total thickness variation of the superstrate is kept within sufficient tolerances such that the bending stiffness variation is within 5% of the desired stiffness variation, which is inversely proportional to the time it takes for the liquid film to planarize the features. In one embodiment, the total thickness variation of the superstrate is kept within sufficient tolerances such that the bending stiffness variation is within 1% of the desired stiffness variation, which is inversely proportional to the time it takes for the liquid film to planarize the features.

While there may be undesirable thickness variation in the superstrate, there are instances when the superstrate thickness has an intentional spatial variation. For example, planarizing a wafer can take several seconds to nearly one minute. In this process, the fluid film originating at the initial point of contact (which is assumed at the center for this embodiment, but could also be at another point, line or area, including substantially close to the edge) and extending radially outwards to the edge of the wafer will be exposed to the superstrate for a longer time than at the edges. Moreover, there may be other parasitic center-edge variations because of systematic errors in upstream processes or anticipated systematic signatures from downstream processes.

The thickness of the superstrate can be varied to compensate for such variations. For example, for unequal process times, the superstrate can be intentionally made thinner at the initial location or area of contact with the thickness gradually increasing towards the final location or area of contact. The PAINT process can be used to make this graded thickness superstrate (see, e.g., U.S. Pat. No. 9,415,418 entitled "Programmable Deposition of Thin Films of a User-Defined Profile with Nanometer Scale Accuracy" which is hereby incorporated by reference in its entirety for all purposes).

In one embodiment, the time it takes for the film to form a contiguous film substantially free of bubbles (called the spread time) can take between 1-10 seconds. In one embodiment, the time between formation of the contiguous film and UV curing of the planarizing film (called the wait time) can take between 1-60 seconds. Because there can be substantial variation in the total process time (spread time and wait time, together), it becomes important to maintain the thickness variation of the superstrate within desired tolerances. For example, in one embodiment, the thickness of the superstrate is designed with the maximum total process time in consideration. This is because keeping the superstrate higher than the thickness defined by the maximum total process time can lead to undesirable parasitics in certain regions of the substrate.

When there is pattern density variation on the substrate, the planarizing film thickness can differ in various regions of the wafer, which can lead to different process time scales across the wafer if the superstrate thickness is kept substantially similar. Usually, the pattern density variation has sharp transitions from one area of the substrate to another, where each area is of the order of several mm square. This implies that any superstrate thickness variation should match the pattern density transitions and can be patterned on the superstrate through photolithography or laser machining based upon the GDS file of the patterned substrate. The idea here is that the process time scale is a function of the product of a function of the superstrate thickness and a function of the planarizing film thickness. Hence, if this product is kept substantially similar across the wafer by changing the superstrate thickness, the overall process time scale across the substrate stays similar. This approach can potentially minimize parasitics that can come from unequal process time scales.

In order to keep the process time scales substantially similar across a wafer having areas with different pattern densities, one strategy is to correspondingly modify the superstrate thickness spatially, as discussed above. This can be enabled using photolithography if the desired superstrate thickness change from one region to another is less than approximately 30 microns. For higher thickness change, other techniques may be needed, such as laser machining or cutting/polishing (for superstrate materials such as quartz, fused silica, etc.), based on the desired spatial variation of thickness corresponding to areas with different pattern density. Laser machining can also be done such that the density of machined artifacts is equivalent to the desired stiffness required in the superstrate. The superstrate can also have alignment marks that can be used to align it with the substrate, where such alignment marks can register the superstrate with the substrate to accuracies of better than 10 microns and 1 micron.

Planarization requires the presence of micro and nanoscale features on the substrate. In one embodiment, the planarization material is deposited using inkjets directly on the patterned substrate or any films that are deposited on the patterned substrate that typically substantially conform with the features on the substrate. In another embodiment, the planarizing material is deposited on the superstrate using inkjets. Because the superstrate is substantially flat without any patterned features, inkjetting of material on the superstrate rather than the substrate can overcome any problems due to the dispensing of drops on features with steep profiles causing discontinuities in the merging of drops before forming a planarizing film.

In-Situ Metrology

The execution of PAINT for planarization can be combined with in-situ metrology to determine in real-time, near real-time or offline conditions, the performance of the planarization process. This in-situ metrology can be optical-based (e.g., thin film reflectometry) or tip-based (e.g., AFM-based). The AFM system can be a single AFM or array of AFMs that are individually addressable to position them in hot spot areas. Optical techniques for metrology or for detection of particle events (disclosed below) may rely on the use of imaging systems, where such imaging systems can be line-scan cameras or areal cameras, that may be coupled with telecentric lenses for minimizing signatures from off-axis images. For high resolution, linescan cameras may be the preferred embodiment because these cameras can be installed inline and used in conjunction with a linear array of UV LEDs to benefit from the motion of the substrate when UV curing is carried out in a separate station. The use of grayscale cameras can also lead to higher resolution, although RGB cameras may also be used for this purpose if hyperspectral signatures are desired. Pixel sizes in such cameras can be less than 100 ums, 10 ums or even as low as 1 um.

This is particularly useful when the models underpinning the process are based on some empirical experimental evidence (often called, grey-box models when they are combined with some physical understanding of the process or black-box models when they are agnostic to the physics of the process). The metrology can be conducted on one or more locations on the substrate depending on the requirements. Alternatively, the determination of optimum metrology locations can be done using intelligent sampling. Moreover, in-situ metrology can also be used to monitor and "sense" the planarization process, which can be useful for continuous system refinement, especially for grey or black-box models. This can, in turn, facilitate predictive analytics and virtual metrology, i.e., the process of predicting an impending defect or failure due to factors such as the inkjet volumes changing due to a systematic parasitic, and the process of determining where and what to measure, respectively.

Particle contamination can also be a problem during execution of this process. The presence of a particle on the substrate or superstrate can lead to voids and losses in yield where the superstrate is unable to force drops in the vicinity of the particle to merge. The size of the voids is typically much larger than the size of the particle itself, and can be as much as 1000 times larger than the particle, if the superstrate is fused silica and the particle is a sharp polymer (see, e.g., Singhal S, Grigas M A, Sreenivasan S V. Mechanics-Based Approach for Detection and Measurement of Particle Contamination in Proximity Nanofabrication Processes. ASME. J. Micro Nano-Manuf. 2016; 4(3):031004-031004-7. doi: 10.1115/1.4033742 which is hereby incorporated by reference in its entirety for all purposes). The size of these voids can be dependent on both, the thickness of the superstrate as well as the elastic modulus of the superstrate. Hence, it is important to control the undesired variation in the thickness of the superstrate to allow in-situ detection and accurate characterization of such particle events.

In-situ detection of the particle during spreading can be captured by discontinuities or anomalies in the flow of the liquid front. These anomalies can be captured in real-time through image-processing techniques and used to make decisions regarding the size and material of the particle contaminant. Optical metrology should be carried out prior to separation to detect particle events, and also to inspect the superstrate in areas close to particle events for any damage caused by such events, and can be done either through an array of camera or a single camera. The system can scan the substrate in a single direction (linescan) or in multiple directions (areal). The optical metrology system detects the particle event and uses the exclusion zone and the transition zone information to detect at least one of the particle size, the particle height, or force applied on the superstrate.

Separation of Superstrate

The separation of the superstrate from the substrate is also an important step in the PAINT process and should be done with minimal damage to the planarizing film. For this purpose, a shape control system as disclosed earlier can be useful. Another way to enable separation in this situation is to have a shield with pins that can move in and out of the hollow center. This shield can be moved out when UV light needs to be exposed and moved back in to substantially contact the backside of the superstrate and provide extra support during separation. The pins can be augmented with the help of adhesives such as Geckskin (see, e.g., http://geckskin.umass.edu). Alternatively, the superstrate chuck can have foldable wings that can attach to the edge of the superstrate during separation with the help of such Geckskin like adhesives. A third strategy can be the use of a sacrificial polymer film on the superstrate which can be evaporated partially or substantially using heat at the edges. This evaporation would cause a clearance at the edges and enable separation of the superstrate from the substrate.

The separation of the superstrate from the substrate can be difficult when there are regions of inflexion in the superstrate or substrate shape or curvature, or if the superstrate can only be held on a narrow annular region, substantially smaller than the overall superstrate diameter, due to process constraints. While separating, the adhesion of the superstrate with the chuck along this narrow annulus should overcome the adhesion of the entire superstrate area with the planarizing polymer film.

This can be enabled by either strengthening the adhesion of the superstrate with the chuck through mechanisms such as the Geckskin described above, or by reducing the interfacial strength of the superstrate-polymer film laminate. The latter can be achieved by coating the superstrate with an anti-stick material such as PTFE. In such circumstances when the superstrate and substrate are "bonded" through the planarizing film, the defect-free initiation of the peeling "crack" at the right interface becomes highly important. One strategy to initiate a crack can be the use of acoustic agitation. This is because there are multiple interfaces across widely different materials during the sub-process of separation. Choosing the right acoustic frequency can induce vibrations at the desired interface of the superstrate and the polymer film and thereby initiate a crack.

The crack can be initiated by modifying the superstrate design to have greater compliance at the edges. This is because the energy release rate is inverse proportional to an effective elastic modulus of the interface and higher compliance, i.e., lower rigidity, would imply a greater energy release rate and ease of delamination. The compliance can be obtained by either reducing the thickness of the superstrate at the edge (as the energy release rate is also inversely proportional to an exponential of the thickness of the superstrate) or by adding a thin surface at the edge with a material that is substantially less rigid than the bulk superstrate material. The need to have a thinner or more compliant superstrate is in direct conflict with the need to have a thicker superstrate to compensate for unequal spreading times, assuming that the initial point of contact is the center and the final point of contact is the edge of the wafer. This conflict can be managed by prioritizing the edge thickness of the superstrate in the crack initiation region and then prioritizing the superstrate thickness in the remaining portion of the superstrate for optimum spreading.

The separation of the superstrate from the substrate can also be carried out at different locations. In one embodiment, the superstrate and substrate are brought into contact with each other at one location inside the tool. The superstrate is mounted on a superstrate chuck at this location of the tool, where the superstrate chuck is an annular ring with a cavity in the middle to enable UV light curing. After curing is completed, the superstrate is released by reducing the vacuum such that the substrate and superstrate "sandwich" is now supported substantially by the substrate chuck.

The thin film of the planarizing material bonds the two surfaces together. The substrate chuck is then moved to a second location inside the tool where the superstrate is positioned under a chuck or mount that can lend substantially greater support to the superstrate than the annular ring chuck in the first location. This is because the superstrate chuck at the second location need not have a substantially large cavity in the middle to allow UV curing of the substrate. The superstrate chuck at this second location adheres to the superstrate at the back with the help of vacuum or mechanical grasps (e.g., Geckskin finger described earlier). The superstrate is then peeled off the substrate leaving the planarizing film behind on the substrate.

In another embodiment of the above concept, the substrate and superstrate are brought into contact with the formation of the contiguous planarizing film in between, in one station. This is followed by UV curing in another station, followed by separation in a third station or in the same initial station as where contact between the substrate and superstrate was made. It is understood that the planarizing film will be substantially liquid when it is transported from the initial station to the UV curing station. Because the average film thickness is small, the liquid film essentially acts like a liquid adhesive between the superstrate and the substrate without redistributing, which is further ensured by keeping the superstrate thickness optimally low. The liquid planarizing film can be partially cured at the edges in the initial station by a ring of LEDs or UV light sources that project substantially at the edges. This would solidify the film at the edges and thereby form a seal around the sandwich. This process can be parallelized by having at least two substrate chucks such that when a substrate is in the UV curing station, a second substrate is brought under the first station to begin execution of the process.

Nanoimprint Lithography

One of the key defect mechanisms in nanoimprint lithography is the trapping of air bubbles or voids. These typically occur when two or more drops are unable to merge substantially or are unable to substantially fill the nanoscale features of the template. These defects are often quite repeatable and can be classified as systematic errors rather than random errors. The filling of nanoscale features typically depends on the phenomenon of capillary pinning, where a moving meniscus encounters a sharp transition in the template because of a nanoscale feature. The meniscus can be forced to traverse the sharp transition and thus fill the feature, but only if there is significant capillary pressure that overcomes the resistance presented by that transition. If the features are significantly tall, the meniscus may not be able to wet them completely, and thus, could lead to the trapping of voids.

One way to force the liquid to wet the features is to apply pressure on the template such that the liquid film is further squeezed, using a pressure zone chuck for example. However, this may cause problems with the template straining and thus distorting the overlay specifications. Another way would be to locally heat the liquid such that there is a local temperature change in the liquid. This temperature change can create a pressure differential and force the liquid to navigate the nanoscale feature. The local heating of the liquid can be done from the substrate side through individually addressable micro-heaters over areas less than 1 mm$^2$, focusing on regions where there are such systematic defects. However, this heat may also cause the substrate to expand and thus, disturb the overlay specification.

Another way to heat the substrate is through the use of spatial light modulators such as digital micromirror devices (DMDs). Current DMDs have pixel sizes that are sub-10 microns, and hence, areas as small as the pixel sizes can be selectively heated. The projection of light can be done either through the template or the substrate. Because the resist absorbs heavily in UV and gets cross-linked in these wavelengths, the preferred wavelength should be in the infra-red. For example, monomers such as Methyl Methacrylate have absorption peaks in the IR region as well. In this region, both quartz and Silicon can be transparent, thereby providing a way to effectively heat the liquid resist composition without crosslinking it. Alternatively, if sufficiently low power UV light can be provided such that even if the resist cross-links, it does not do so fully and can still flow, UV wavelengths may also be used. However, such light would have to come from the template side, since Silicon heavily absorbs UV light.

Similar to planarization, fluid flow in nanoimprint lithography can also be determined by the extended thin film lubrication. One way to obtain information about the hot spots in the process can be with the help of dummy templates. Such dummy templates can be patterned with a resolution that is less stringent than the actual templates used for nanoimprint lithography, where such feature resolutions can be less than 100 nm. The key here is that the length scales of the features on the dummy templates should be sufficient to capture key physical characteristics, such as the bulk flow, similar to the actual nanoscale template. This would substantially reduce cost in capturing defect data for the nanoimprint lithography process, and is made possible because the fluid would essentially be agnostic to the presence of features below a certain length scale, and would interact primarily with features above that length scale. Hence, a template having features above this critical length scale, given in one embodiment as a combination of fluid properties and process time, would be sufficient to capture defects arising out of the bulk fluid characteristics.

Figure 6:
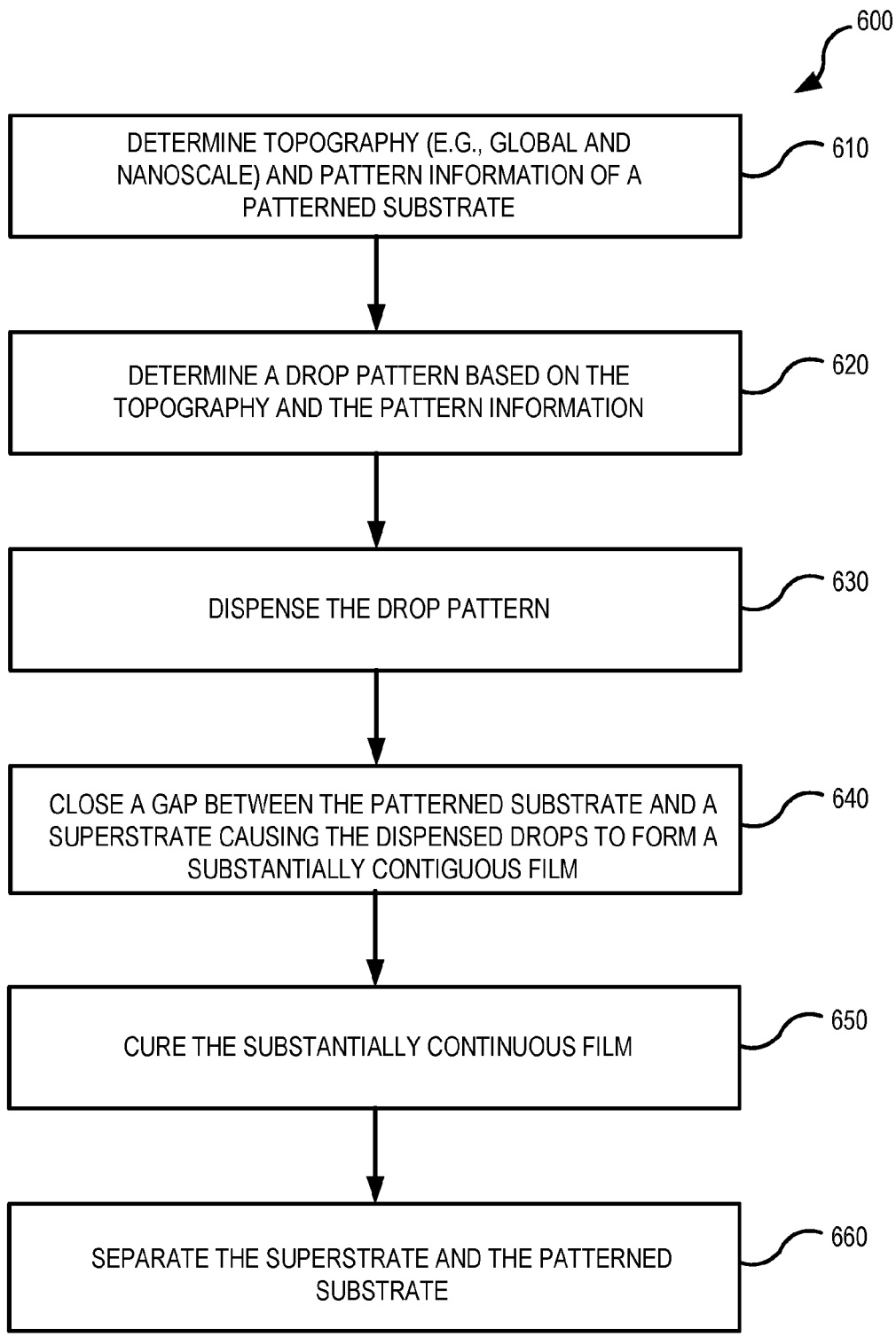
FIG. 6 is flowchart illustrating a set of operations for substrate planarization in accordance with one or more embodiments of the present technology.

FIG. 6 is flowchart illustrating a set of operations 600 for substrate planarization in accordance with one or more embodiments of the present technology. As illustrated in FIG. 6, determination operation 610 can determine the topography (e.g., on global and nanoscale) and pattern information of a patterned substrate. For example, in some embodiments, the topography of a patterned substrate can be obtained using instruments like a Zygo interferometer. The pattern information, which may include pattern density, anisotropy, area, and geometric information such as height/depth, width, diameter, etc., is usually available as an input. If the pattern information is not available as an input, the pattern information can be determined from microscopy/inspection instruments (e.g., SEM, AFM, etc.).

Based on the topography and patterned substrate information, drop pattern operation 620 can determine a drop pattern which can be dispensed during dispensing operation 630. In some embodiments, the drop pattern can be determined using an inverse optimization approach, where the inverse optimization scheme uses a drop pattern to solve a model representing the system. Once a given drop pattern represents the system to within a specified tolerance of the desired result, that drop pattern is determined to be optimum. In this approach, system parameters (e.g., inkjet nozzle pitch, rheology of the liquid, existing topography of the substrate, etc.) can be given as inputs, as these influence the model representation of the system. For example, the presence of substrate topography in an area will require additional material to be deposited in that area to fill the existing topography. This will influence the optimum drop pattern to allow more liquid to be deposited in that area.

Closing operation 640 can close a gap between the patterned substrate and a superstrate causing the dispensed drops to form a substantially continuous film. For example, in some embodiments, the substrate and superstrate can be mounted on chucks. The chucks can be moved closer to each other relatively, through actuators such as spring-loaded voice coils. Curing operation 650 can cure the substantially continuous film created by closing operation 640. For example, in some embodiments curing can be done with the help of UV light. This depends on the formulation of the liquid material. The curing step hardens the liquid material to make it a polymer film, essentially freezing the evolution of the superstrate-fluid-substrate sandwich. Hence, the curing step should typically be carried out after the desired evolution of the sandwich has been achieved.

Once curing operation 650 is complete separation operation 660 can separate the superstrate and the patterned substrate. Separation of the superstrate from the cured film deposited on the patterned substrate can be done in a variety of ways as described above. Strategies include, but are not limited to, the use of shields, a sacrificial material, Geckskin, etc. After the crack has been initiated, the superstrate and substrate chucks can be moved away from each other relatively, by using similar actuators as described above (e.g., spring loaded voice coils).

Figure 7:
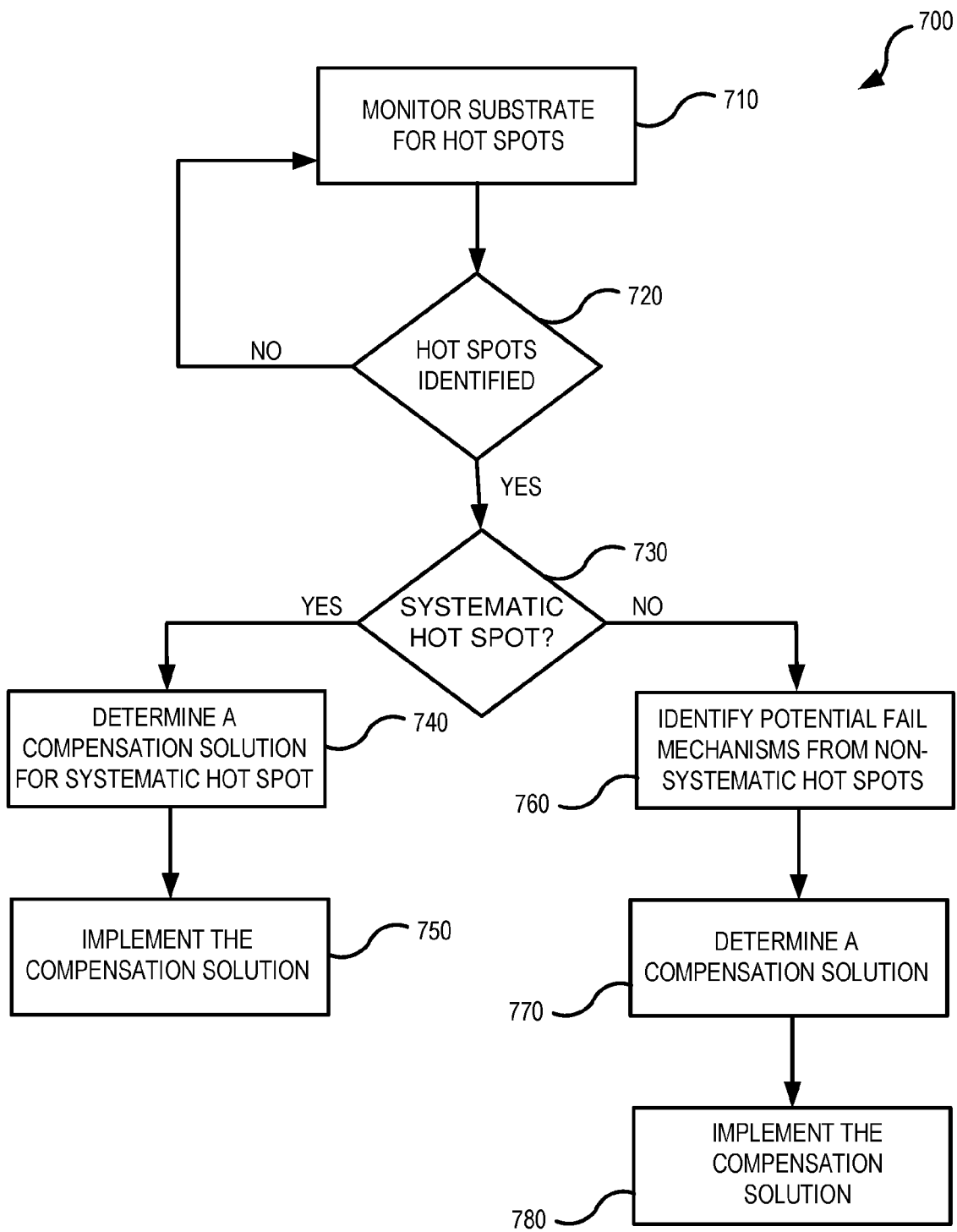
FIG. 7 is a flowchart illustrating a set of operations for identifying and compensating for hot spot in accordance with some embodiments of the present technology.

FIG. 7 is a flowchart illustrating a set of operations 700 for identifying and compensating for hot spot in accordance with some embodiments of the present technology. As illustrated in FIG. 7, monitoring operation 710 can monitor for hot spots. In accordance with various embodiments, hot spots can be monitored using in-situ metrology techniques, such as optical cameras, microscopes and AFMs, as described earlier. Hot spots can be identified based on their signature—for example, a hot spot caused by a particle will have a typical signature of a circular area with no pattern, where the circular area has a diameter that can approach $1000\lambda$ the size of the particle. Other hot spots can be identified as for example, straight lines of low/no film thickness can be attributed to a misfiring nozzle on the inkjet. This may require changing the inkjet altogether if a nozzle is substantially damaged. In general, a hot spot represents a substantial departure from the ideal process performance outside the given tolerance window across a given area.

Determination operation 720 can determine whether any hotspots have been identified. When determination operation 720 fails to identify any hot spots, determination operation 720 branches to monitoring operation 710 where the system can continue to monitor for hot spots. When determination operation 720 identifies a hot spot, determination operation 720 branches to determination operation 730 where an assessment is made as to whether the identified hot spot is a systematic hot spot. A classic example of a systematic hot spot will be the missing nozzle mentioned previously. A systematic hot spot can be thought of as a repeating error in the system caused by non-random events. Particle encounters for example, are random hot spots. Usually, the machines are repeatable, so if the same signature is observed across multiple fields, one can make the determination that there is something incorrectly tuned in the machine. This incorrect parameter can be related to the tool design itself, or related to a process parameter (such as low process times leading to the presence of bubbles and voids).

When determination operation 730 determines that the hot spot is a systematic hot spot, then determination operation 730 branches to identification operation 740 where a compensation solution is identified. As mentioned previously, if a similar signature is observed across multiple fields, one can make the determination that it is a systematic hot spot. Implantation operation 750 can then implement the compensation solution. In accordance with various embodiments, systematic hot spots can be compensated by correctly tuning the incorrect parameter. For example, if a drop has been incorrectly placed or pinned on a substrate topography feature due to systematic inkjet misfiring which is difficult to fix because of the geometry of the inkjet, a compensation solution can be to locally move the drop using thermocapillary or other mechanisms.

When determination operation 730 determines that the hot spot is not a systematic hot spot, then determination operation 730 branches to identification operation 760 that identifies potential fail mechanisms from non-systematic hot spots. Potential fail mechanisms from non-systematic hot spots, such as particles include loss of patterning or film deposited due to incomplete fluid filling or even damage to the superstrate for IAP or template for NIL. Such hot spots can be identified using real-time in-situ optical inspection techniques, for example.

Compensation operation 770 determines a compensation solution which is implemented by implementation operation 780. Compensation solutions for random hot spots may require in-situ correction as these do not repeat and can cause yield loss. For example, an inkjet has a stochastic drop placement accuracy because of which the drops may be placed within a circular region around the ideal spot. If this circular region encompasses regions of pattern density variation, random hot spots may be expected because of the drops interacting with different features. Such hot spots may be compensated for by first identifying them and then implementing solutions such as thermocapillary, acoustics, or the like. The compensation solution depends on the nature of the hot spot.

Systematic hot spots require a deeper understanding of the root cause and therefore, may need systematic changes in the tool design and process parameters. Random hot spots on the other hand, may require temporary interventions. There can be situations when the same compensation solutions may be proposed for both random and systematic hot spots. For example, thermocapillary actions may be used for locally changing the distribution of drops in the case of random inkjet drop placement variation, as well as for drops missing due to a systematically misfiring nozzle.

Exemplary Computer System Overview

Aspects and implementations of the present technology have been described in the general context of various steps and operations. A variety of these steps and operations may be performed by hardware components or may be embodied in computer-executable instructions, which may be used to cause a general-purpose or special-purpose processor (e.g., in a computer, server, or other computing device) programmed with the instructions to perform the steps or operations. For example, the steps or operations may be performed by a combination of hardware, software, and/or firmware.

Figure 8:
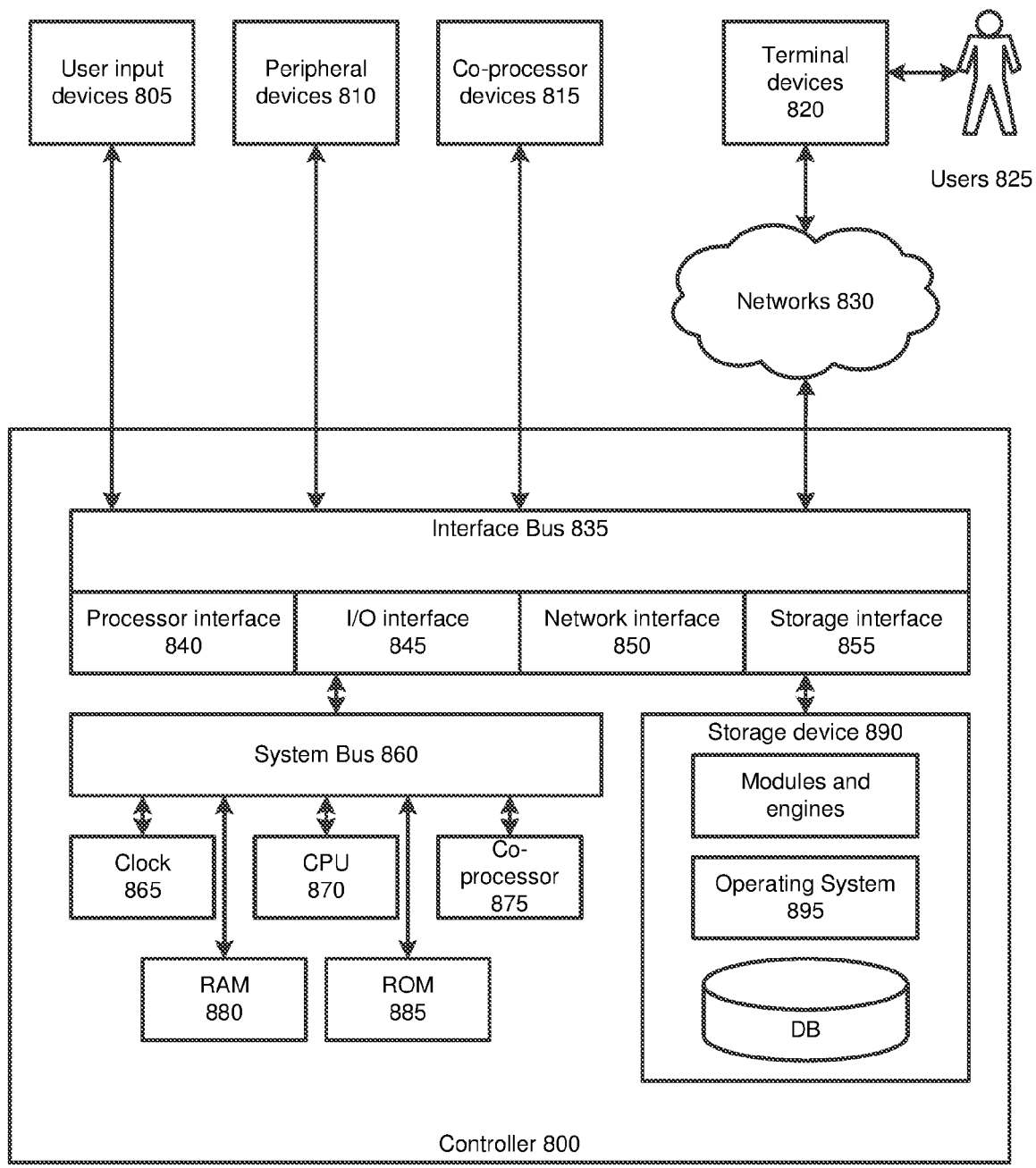
FIG. 8 is an example of a computing system that may be used to perform various computations and/or control equipment in some embodiments of the present technology.

FIG. 8 is a block diagram illustrating an example machine representing the computer systemization of the planarization system. The controller 800 may be in communication with entities including one or more users 825 client/terminal devices 820, user input devices 805, peripheral devices 810, an optional co-processor device(s) (e.g., cryptographic processor devices) 815, and networks 830. Users may engage with the controller 800 via terminal devices 820 over networks 830.

Computers may employ central processing unit (CPU) or processor to process information. Processors may include programmable general-purpose or special-purpose microprocessors, programmable controllers, application-specific integrated circuits (ASICs), programmable logic devices (PLDs), embedded components, combination of such devices and the like. Processors execute program components in response to user and/or system-generated requests. One or more of these components may be implemented in software, hardware or both hardware and software. Processors pass instructions (e.g., operational and data instructions) to enable various operations.

The controller 800 may include clock 865, CPU 870, memory such as read only memory (ROM) 885 and random access memory (RAM) 880 and co-processor 875 among others. These controller components may be connected to a system bus 860, and through the system bus 860 to an interface bus 835. Further, user input devices 805, peripheral devices 810, co-processor devices 815, and the like, may be connected through the interface bus 835 to the system bus 860. The interface bus 835 may be connected to a number of interface adapters such as processor interface 840, input output interfaces (I/O) 845, network interfaces 850, storage interfaces 855, and the like.

Processor interface 840 may facilitate communication between co-processor devices 815 and co-processor 875. In one implementation, processor interface 840 may expedite encryption and decryption of requests or data. Input output interfaces (I/O) 845 facilitate communication between user input devices 805, peripheral devices 810, co-processor devices 815, and/or the like and components of the controller 800 using protocols such as those for handling audio, data, video interface, wireless transceivers, or the like (e.g., Bluetooth, IEEE 1394a-b, serial, universal serial bus (USB), Digital Visual Interface (DVI), 802.11a/b/g/n/x, cellular, etc.). Network interfaces 850 may be in communication with the network 830. Through the network 830, the controller 800 may be accessible to remote terminal devices 820. Network interfaces 850 may use various wired and wireless connection protocols such as, direct connect, Ethernet, wireless connection such as IEEE 802.11a-x, and the like.

Examples of network 830 include the Internet, Local Area Network (LAN), Metropolitan Area Network (MAN), a Wide Area Network (WAN), wireless network (e.g., using Wireless Application Protocol WAP), a secured custom connection, and the like. The network interfaces 850 can include a firewall which can, in some aspects, govern and/or manage permission to access/proxy data in a computer network, and track varying levels of trust between different machines and/or applications. The firewall can be any number of modules having any combination of hardware and/or software components able to enforce a predetermined set of access rights between a particular set of machines and applications, machines and machines, and/or applications and applications, for example, to regulate the flow of traffic and resource sharing between these varying entities. The firewall may additionally manage and/or have access to an access control list which details permissions including, for example, the access and operation rights of an object by an individual, a machine, and/or an application, and the circumstances under which the permission rights stand. Other network security functions performed or included in the functions of the firewall, can be, for example, but are not limited to, intrusion-prevention, intrusion detection, next-generation firewall, personal firewall, etc., without deviating from the novel art of this disclosure.

Storage interfaces 855 may be in communication with a number of storage devices such as, storage devices 890, removable disc devices, and the like. The storage interfaces 855 may use various connection protocols such as Serial Advanced Technology Attachment (SATA), IEEE 1394, Ethernet, Universal Serial Bus (USB), and the like.

User input devices 805 and peripheral devices 810 may be connected to I/O interface 845 and potentially other interfaces, buses and/or components. User input devices 805 may include card readers, finger print readers, joysticks, keyboards, microphones, mouse, remote controls, retina readers, touch screens, sensors, and/or the like. Peripheral devices 810 may include antenna, audio devices (e.g., microphone, speakers, etc.), cameras, external processors, communication devices, radio frequency identifiers (RFIDs), scanners, printers, storage devices, transceivers, and/or the like. Co-processor devices 815 may be connected to the controller 800 through interface bus 835, and may include microcontrollers, processors, interfaces or other devices.

Computer executable instructions and data may be stored in memory (e.g., registers, cache memory, random access memory, flash, etc.) which is accessible by processors. These stored instruction codes (e.g., programs) may engage the processor components, motherboard and/or other system components to perform desired operations. The controller 800 may employ various forms of memory including on-chip CPU memory (e.g., registers), RAM 880, ROM 885, and storage devices 890. Storage devices 890 may employ any number of tangible, non-transitory storage devices or systems such as fixed or removable magnetic disk drive, an optical drive, solid state memory devices and other processor-readable storage media. Computer-executable instructions stored in the memory may include one or more program modules such as routines, programs, objects, components, data structures, and so on that perform particular tasks or implement particular abstract data types. For example, the memory may contain operating system (OS) component 895, modules and other components, database tables, and the like. These modules/components may be stored and accessed from the storage devices, including from external storage devices accessible through an interface bus.

The database components can store programs executed by the processor to process the stored data. The database components may be implemented in the form of a database that is relational, scalable and secure. Examples of such database include DB2, MySQL, Oracle, Sybase, and the like. Alternatively, the database may be implemented using various standard data-structures, such as an array, hash, list, stack, structured text file (e.g., XML), table, and/or the like. Such data-structures may be stored in memory and/or in structured files.

The controller 800 may be implemented in distributed computing environments, where tasks or modules are performed by remote processing devices, which are linked through a communications network, such as a Local Area Network ("LAN"), Wide Area Network ("WAN"), the Internet, and the like. In a distributed computing environment, program modules or subroutines may be located in both local and remote memory storage devices. Distributed computing may be employed to load balance and/or aggregate resources for processing. Alternatively, aspects of the controller 800 may be distributed electronically over the Internet or over other networks (including wireless networks). Those skilled in the relevant art(s) will recognize that portions of the system may reside on a server computer, while corresponding portions reside on a client computer. Data structures and transmission of data particular to aspects of the controller 800 are also encompassed within the scope of the disclosure.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A method for planarization of a patterned substrate using inkjets, the method comprising:
   determining global and nanoscale topography and pattern information of the patterned substrate;
   determining, based upon the global and nanoscale topography and the pattern information, a drop pattern;
   dispensing the drop pattern on the patterned substrate;
   closing a gap between the patterned substrate and a superstrate causing the dispensed drops to form a substantially contiguous film, wherein a thickness of the superstrate is designed to be spatially varying;
   curing the substantially contiguous film; and
   separating the superstrate and the patterned substrate from the substantially contiguous film on the patterned substrate.

2. The method of claim 1, wherein the drop pattern is determined from a model of a process, an optimization scheme, and experimental data.

3. The method of claim 1, further comprising loading a digital file encoded with data representing the global and nanoscale topography and the pattern information of the patterned substrate.

4. The method of claim 1, wherein the drop pattern is computed using model-based optimization with inputs including the global and nanoscale topography and the pattern information, superstrate geometry, superstrate material properties, planarizing material properties, inkjet drop resolution, inkjet nozzle pitch, and tolerance information.

5. The method of claim 1, wherein a surface of the superstrate is substantially more convex than the surface of the substrate at a location of a spreading front.

6. The method of claim 1, wherein the superstrate has a sacrificial film and the method further comprises, ablating the sacrificial film to initiate peeling to separate the superstrate from the substrate.

7. The method of claim 1, further comprising prioritizing planarization performance in a sub-region of a semiconductor device die.

8. The method of claim 7, wherein the sub-region of the semiconductor device die corresponds to a portion of the semiconductor device die where a highest lithographic resolution is needed during a subsequent lithography process.

9. The method of claim 7, wherein the sub-region is aligned orthogonal to a scanning direction of a photolithography scanner during exposure, wherein the photolithography scanner is a downstream process whose focus benefits from a surface topography control.

10. The method of claim 7, wherein the inkjet is aligned parallel to the sub-region.

11. The method of claim 1, wherein the gap is closed at a first station and curing is performed at a second station.

12. The method of claim 11, wherein curing is performed at the end of a desired process time, where the desired process time is chosen to be high enough such that bubbles are substantially mitigated and low enough to prevent undesirable parasitics from affecting planarization performance.

* * * * *